(12) United States Patent
Ichikawa et al.

(10) Patent No.: US 8,846,294 B2
(45) Date of Patent: *Sep. 30, 2014

(54) PHOTORESIST COMPOSITION

(75) Inventors: Koji Ichikawa, Osaka (JP); Yukako Anryu, Osaka (JP); Satoshi Yamaguchi, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/434,251

(22) Filed: Mar. 29, 2012

(65) Prior Publication Data

US 2012/0251946 A1    Oct. 4, 2012

(30) Foreign Application Priority Data

Apr. 1, 2011  (JP) ................. 2011-081496

(51) Int. Cl.
| | |
|---|---|
| *G03F 7/004* | (2006.01) |
| *G03F 7/30* | (2006.01) |
| *G03F 7/38* | (2006.01) |
| *G03F 7/039* | (2006.01) |
| *G03F 7/20* | (2006.01) |

(52) U.S. Cl.
CPC ............ *G03F 7/0045* (2013.01); *G03F 7/38* (2013.01); *G03F 7/0392* (2013.01); *G03F 7/0397* (2013.01); *G03F 7/2041* (2013.01); *Y10S 430/111* (2013.01)
USPC .......... 430/270.1; 430/326; 430/330; 430/910

(58) Field of Classification Search
CPC ........ G03F 7/0397; G03F 7/0045; G03F 7/38
USPC ................. 430/270.1, 905, 910, 326, 330
See application file for complete search history.

(56) References Cited

U.S. PATENT DOCUMENTS

| | | |
|---|---|---|
| 2002/0098443 A1 | 7/2002 | Hatakeyama et al. |
| 2011/0076617 A1 | 3/2011 | Yamaguchi et al. |

FOREIGN PATENT DOCUMENTS

JP    2012-8551 A    1/2012

*Primary Examiner* — John Chu
(74) *Attorney, Agent, or Firm* — Birch, Stewart, Kolasch & Birch, LLP

(57) ABSTRACT

The present invention provides a photoresist composition comprising the following components (A), (B) and (X):
(A) a resin being insoluble or poorly soluble in an aqueous alkali solution but becoming soluble in an aqueous alkali solution by the action of an acid,
(B) an acid generator,
(X) at least one compound selected from the group consisting of a compound represented by the formula (I-a):

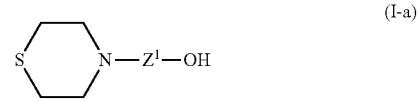

(I-a)

wherein $Z^1$ represent a C1-C20 divalent saturated aliphatic hydrocarbon group in which one or more —$CH_2$— may be replaced by —O— or —CO—, and a compound represented by the formula (I-b):

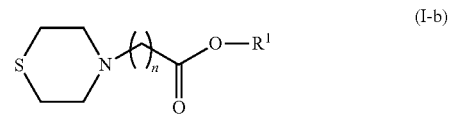

(I-b)

wherein $R^1$ represents a C1-C20 monovalent saturated aliphatic hydrocarbon group in which one or more hydrogen atoms may be substituted with a hydroxyl group and one or more —$CH_2$— may be replaced by —O— or —CO—, and n represents 0 or 1.

10 Claims, No Drawings

PHOTORESIST COMPOSITION

This nonprovisional application claims priority under 35 U.S.C. §119(a) on Patent Application No. 2011-081496 filed in JAPAN on Apr. 1, 2011, the entire contents of which are hereby incorporated by reference.

FIELD OF THE INVENTION

The present invention relates to a photoresist composition.

BACKGROUND OF THE INVENTION

A photoresist composition is used for semiconductor microfabrication employing a lithography process.

US 2002/0098443 A1 discloses a photoresist composition comprises an acid generator, a resin having an acid-labile group, being insoluble or poorly soluble in an aqueous alkali solution but becoming soluble in an aqueous alkali solution by the action of an acid, and a compound represented by the following formula.

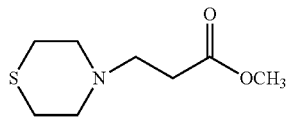 [SMILES: COC(=O)CCN1CCSCC1]

SUMMARY OF THE INVENTION

The present invention is to provide a photoresist composition.

The present invention relates to the followings:

[1] A photoresist composition comprising the following components (A), (B) and (X):

(A) a resin being insoluble or poorly soluble in an aqueous alkali solution but becoming soluble in an aqueous alkali solution by the action of an acid, (B) an acid generator, (X) at least one compound selected from the group consisting of a compound represented by the formula (I-a):

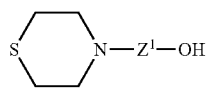

wherein $Z^1$ represent a C1-C20 divalent saturated aliphatic hydrocarbon group in which one or more —$CH_2$— may be replaced by —O— or —CO—, and a compound represented by the formula (I-b):

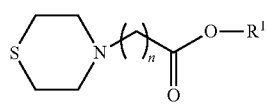

wherein $R^1$ represents a C1-C20 monovalent saturated aliphatic hydrocarbon group in which one or more hydrogen atoms may be substituted with a hydroxyl group and one or more —$CH_2$— may be replaced by —O— or —CO—, and n represents 0 or 1;

[2] The photoresist composition according to [1], wherein component (X) is the compound represented by the formula (I-a);

[3] The photoresist composition according to [1], wherein component (X) is the compound represented by the formula (I-b);

[4] The photoresist composition according to [1] or [2], wherein $Z^1$ is a C1-C12 alkanediyl group or a C6-C20 divalent alicyclic saturated hydrocarbon group in the formula (I-a);

[5] The photoresist composition according to [1] or [3], wherein $R^1$ is a tert-butyl group or a tert-amyl group and n is 0 in the formula (I-b);

[6] The photoresist composition according to any one of [1] to [5], wherein component (B) is a salt represented by the formula (B1):

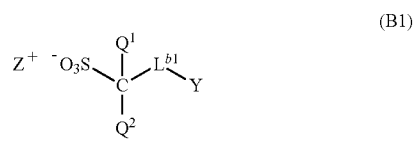

wherein $Q^1$ and $Q^2$ each independently represent a fluorine atom or a C1-C6 perfluoroalkyl group, $L^{b1}$ represents a single bond or a C1-C17 divalent aliphatic hydrocarbon group which can have one or more substituents, and one or more —$CH_2$— in the divalent aliphatic hydrocarbon group can be replaced by —O— or —CO—, Y represents a C1-C18 aliphatic hydrocarbon group which can have one or more substituents and in which one or more —$CH_2$— can be replaced by —O—, —CO— or —$SO_2$—, and $Z^+$ represents an organic cation;

[7] The photoresist composition according to [6], wherein $L^{b1}$ is a group represented by *—CO—O-$L^{b2}$- wherein $L^{b2}$ represents a single bond or a C1-C15 alkanediyl group and * represents a binding position to —$C(Q^1)(Q^2)$- in the formula (B1);

[8] The photoresist composition according to [6] or [7], wherein Y is a C3-C18 alicyclic hydrocarbon group which can have one or more substituents and in which one or more —$CH_2$— can be replaced by —O—, —CO— or —$SO_2$— in the formula (B1);

[9] The photoresist composition according to any one of [1] to [8] which further comprises a solvent;

[10] A process for producing a photoresist pattern comprising:

(1) a step of applying the photoresist composition according to any one of [1] to [9] on a substrate to form a photoresist composition layer, (2) a step of forming a photoresist film by drying the photoresist composition layer formed, (3) a step of exposing the photoresist film to radiation, (4) a step of heating the photoresist film after exposing, and (5) a step of developing the photoresist film after heating.

DESCRIPTION OF PREFERRED EMBODIMENTS

The photoresist composition of the present invention comprises the following components (A), (B) and (X):

(A) a resin being insoluble or poorly soluble in an aqueous alkali solution but becoming soluble in an aqueous alkali solution by the action of an acid (hereinafter, simply referred to as RESIN (A)),
(B) an acid generator,
(X) at least one compound selected from the group consisting of a compound represented by the formula (I-a):

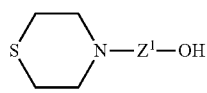
(I-a)

wherein $Z^1$ represent a C1-C20 divalent saturated aliphatic hydrocarbon group in which one or more —$CH_2$— may be replaced by —O— or —CO— (hereinafter, simply referred to as the compound (I-a)), and a compound represented by the formula (I-b):

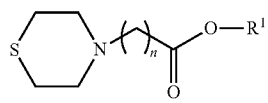
(I-b)

wherein $R^1$ represents a C1-C20 monovalent saturated aliphatic hydrocarbon group in which one or more hydrogen atoms may be substituted with a hydroxyl group and one or more —$CH_2$— may be replaced by —O— or —CO—, and n represents 0 or 1 (hereinafter, simply referred to as the compound (I-b)).

First, component (X) will be illustrated.

Component (X) is the compound (I-a), the compound (I-b) or both thereof.

Examples of the C1-C20 divalent saturated aliphatic hydrocarbon group represented by $Z^1$ include a C1-C20 alkanediyl group, a C3-C20 divalent alicyclic saturated hydrocarbon group and a group formed by combining the above-mentioned alkanediyl group and the above-mentioned divalent alicyclic saturated hydrocarbon group.

Examples of the C1-C20 alkanediyl group include a methylene group, an ethane-1,1-diyl group, an ethane-1,2-diyl group, a propane-1,1-diyl group, a propane-2,2-diyl group, a propane-1,3-diyl group, a propane-1,2-diyl group, a butane-1,3-diyl group, a butane-1,4-diyl group, a pentane-1,5-diyl group, a 2-methylpropane-1,3-diyl group, a 2-methylpropane-1,2-diyl group, a pentane-1,4-diyl group, a 2-methylbutane-1,4-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group, an octadecane-1,18-diyl group, a nonadecane-1,19-diyl group and an icosane-1,20-diyl group.

The alicyclic saturated hydrocarbon group may be monocyclic or polycyclic. Examples of the C3-C20 divalent alicyclic saturated hydrocarbon group include groups formed by removing two hydrogen atoms from the alicyclic saturated hydrocarbons represented by the following formulae (KA-1) to (KA-22).

(KA-1)

(KA-2)

(KA-3)

(KA-4)

(KA-5)

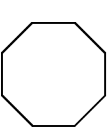
(KA-6)

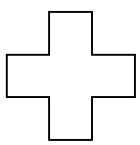
(KA-7)

(KA-8)

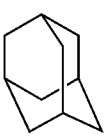
(KA-9)

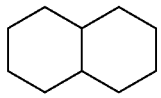
(KA-10)

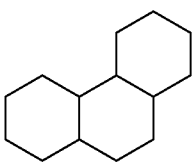
(KA-11)

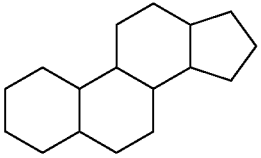
(KA-12)

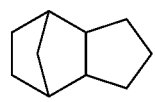
(KA-13)

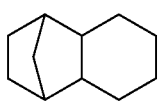
(KA-14)

(KA-15) 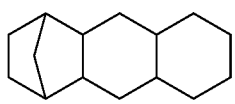
(KA-16) 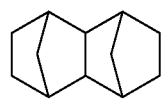
(KA-17) 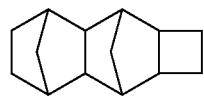
(KA-18) 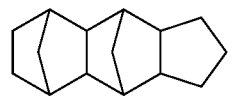
(KA-19) 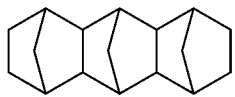
(KA-20) 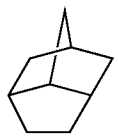
(KA-21) 
(KA-22) 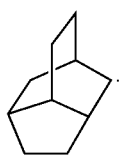
Examples of the group formed by combining the above-mentioned alkanediyl group and the above-mentioned divalent alicyclic saturated hydrocarbon group include the following groups in which one of * is a binding position to the nitrogen atom in the thiomorpholine ring and the other * is a binding position to —OH.
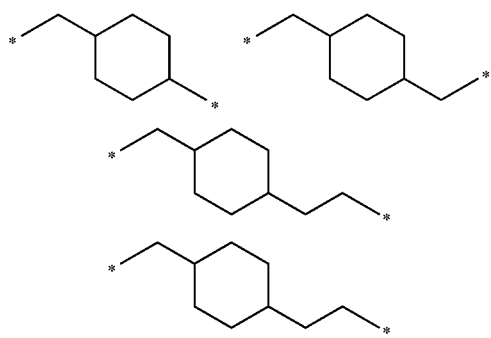
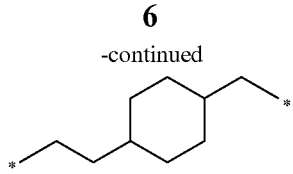
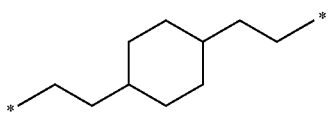
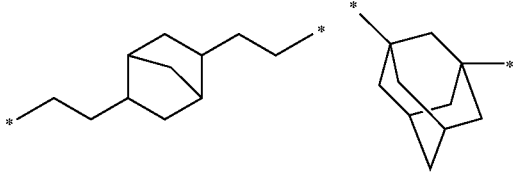
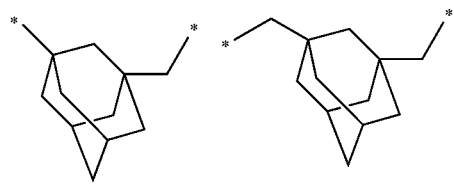
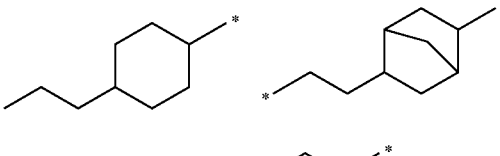
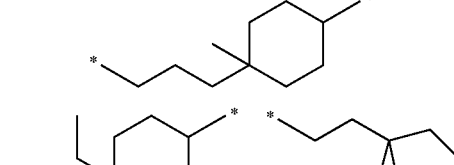
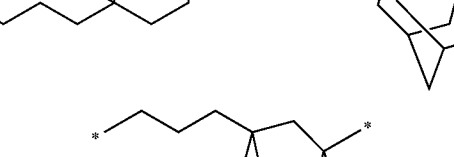
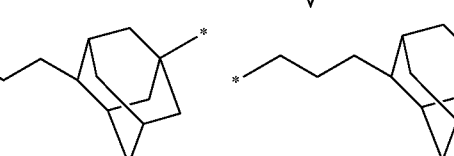
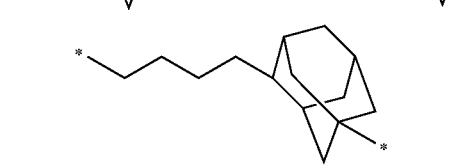

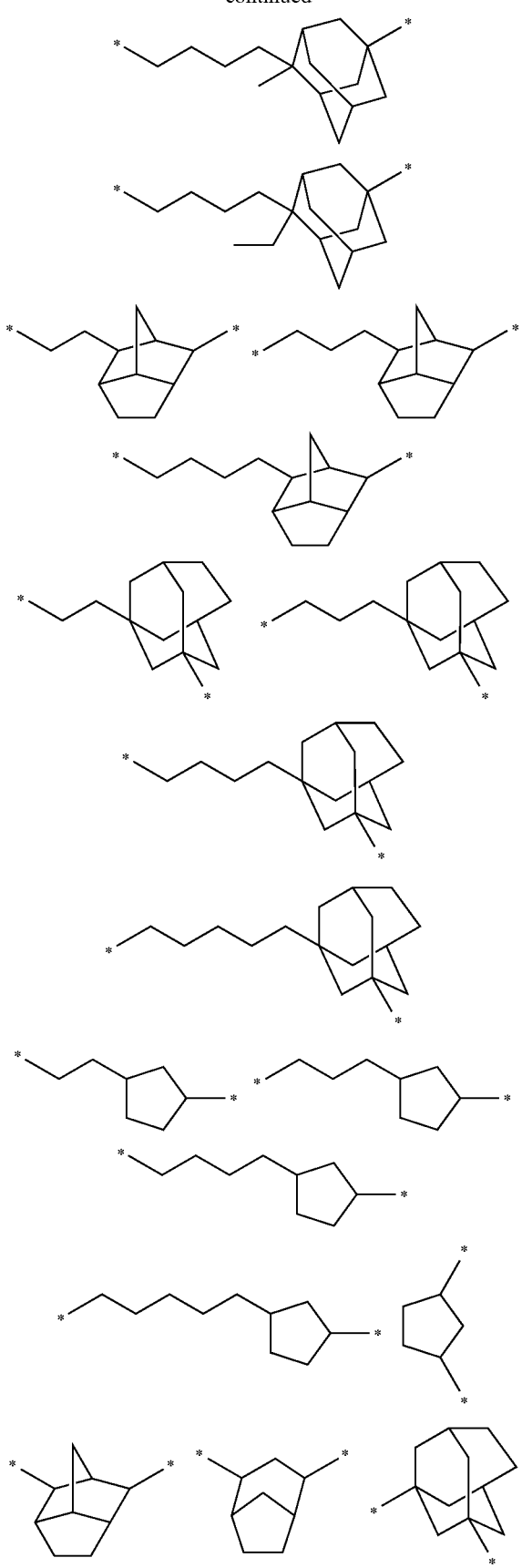
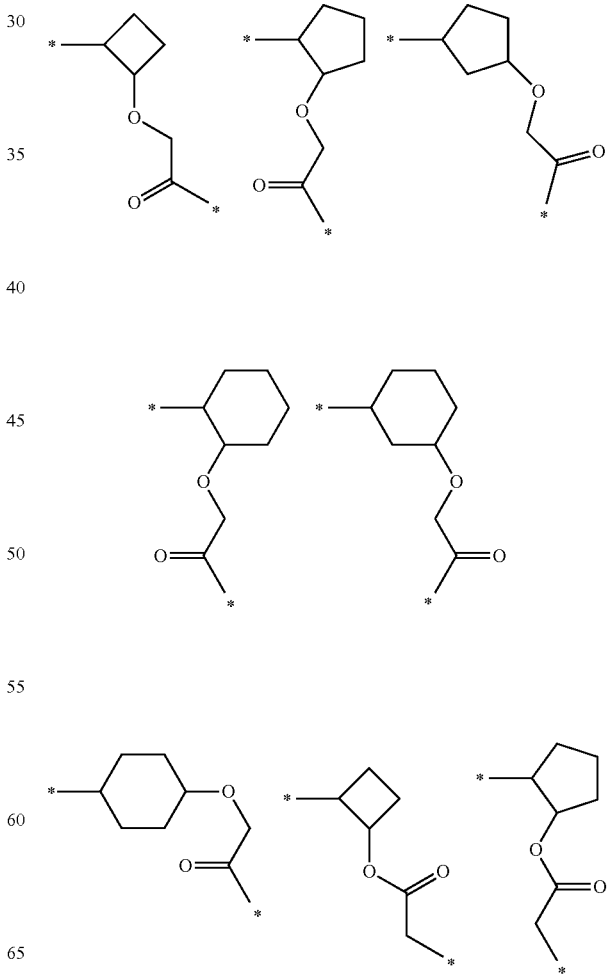

One or more —CH$_2$— in the above-mentioned C1-C20 divalent saturated aliphatic hydrocarbon group may be replaced by —O— or —CO— and examples of the C1-C20 divalent saturated aliphatic hydrocarbon group in which one or more —CH$_2$— are replaced by —O— or —CO— include *—CH$_2$—CH$_2$—O—*, *—CH$_2$—CH$_2$—O—CH$_2$—O—*, *—CH$_2$—CH$_2$—O—CH$_2$—O—CH$_2$—CH$_2$—O—*, *—CH$_2$—CH$_2$—O—CH$_2$—CH$_2$—O—CH$_2$—CH$_2$—O—*, *—CO—O—*, *—CO—O—CH$_2$—*, *—CO—O—CH$_2$—CO—O—*, *—CH$_2$—CH$_2$—O—CO—*, *—CH$_2$—CH$_2$—O—CO—CH$_2$—*, *—CH$_2$—CH$_2$—O—CH$_2$—CO—O—*, *—CH$_2$—CH$_2$—O—CH$_2$—CH$_2$—CO—O—*, *—CH$_2$—CH$_2$—O—CO—CH$_2$—CO—O—*, *—CH$_2$—CH$_2$—O—CO—CH$_2$—O—CO—*, *—CH$_2$—CH$_2$—O—CO—CH$_2$—O—*, *—CH$_2$—CH$_2$—O—CO—O—*, *—CH$_2$—CH$_2$—CO—O—*, *—CH$_2$—CH$_2$—CO—O—CH$_2$—*, *—CH$_2$—CH$_2$—CO—O—CH$_2$—CO—O—*, and the following groups

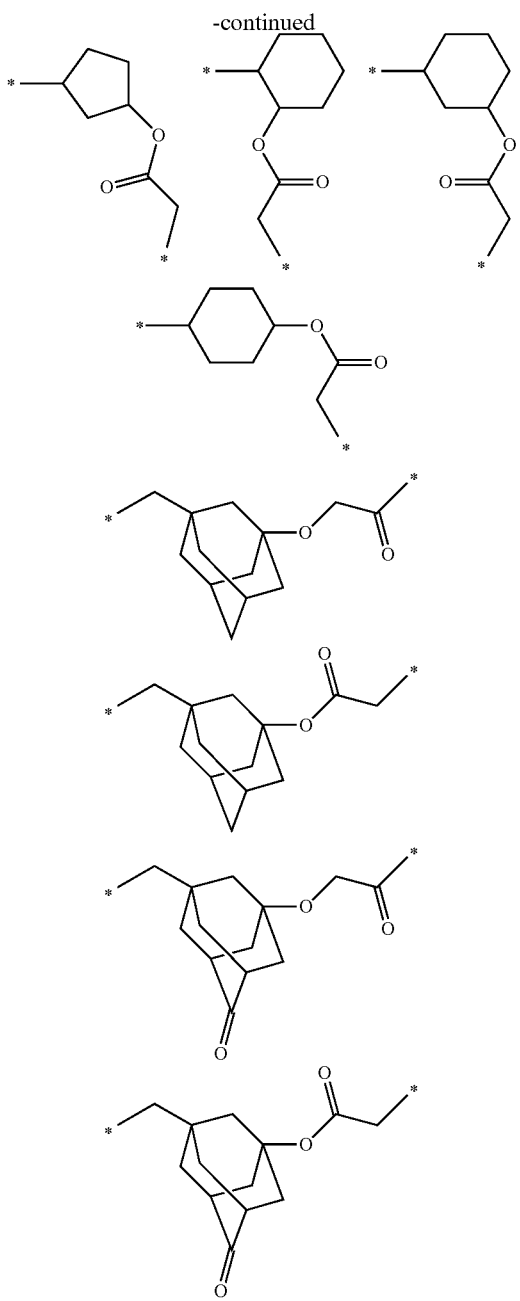

in which one of * is a binding position to the nitrogen atom in the thiomorpholine ring and the other * is a binding position to —OH.

The compound (I-a) wherein $Z^1$ is a C1-C12 alkanediyl group or a C5-C20 divalent alicyclic saturated hydrocarbon group is preferable, and the compound (I-a) wherein $Z^1$ is a C1-C12 alkanediyl group or a C6-C20 divalent alicyclic saturated hydrocarbon group is more preferable, and the compound (I-a) wherein $Z^1$ is a C6-C12 alkanediyl group or a C6-C20 divalent alicyclic saturated hydrocarbon group is still more preferable, and the compound (I-a) wherein $Z^1$ is a C8-C12 alkanediyl group is especially preferable.

Examples of the C1-C20 monovalent saturated aliphatic hydrocarbon group represented by $R^1$ include a C1-C20 alkyl group, a C3-C20 monovalent alicyclic saturated hydrocarbon group and a group formed by combining the above-mentioned alkyl group and the above-mentioned monovalent alicyclic saturated hydrocarbon group.

Examples of the C1-C20 alkyl group include a methyl group, an ethyl group, a propyl group, an isopropyl group, a butyl group, an isobutyl group, a tert-butyl group, a pentyl group, a hexyl group, a heptyl group, an octyl group, a decyl group, a dodecyl group, a tridecyl group, a tetradecyl group, a pentadecyl group, a hexadecyl group, a heptadecyl group, an octadecyl group, a nonadecyl group and an icosyl group, and a C1-C12 alkyl group is preferable and a C1-C8 alkyl group is more preferable. The monovalent alicyclic saturated hydrocarbon group may be monocyclic or polycyclic. Examples of the C3-C20 monovalent alicyclic saturated hydrocarbon group include groups formed by removing one hydrogen atom from the alicyclic saturated hydrocarbons represented by the above-mentioned formulae (KA-1) to (KA-22). Among them, preferred are a cyclopentyl group, a cyclohexyl group, a cycloheptyl group, a cyclooctyl group, a decahydronaphthyl group, an adamantyl group and a norbornyl group.

Examples of the group formed by combining the above-mentioned alkyl group and the above-mentioned monovalent alicyclic saturated hydrocarbon group include those described above as the groups formed by combining the above-mentioned alkanediyl group and the above-mentioned divalent alicyclic saturated hydrocarbon group in which a hydrogen atom is bonded to one of two *.

One or more hydrogen atoms in the C1-C20 monovalent saturated aliphatic hydrocarbon group may be substituted with a hydroxyl group.

One or more —$CH_2$— in the C1-C20 monovalent saturated aliphatic hydrocarbon group may be replaced by —O— or —CO—, and examples of the C1-C20 monovalent saturated aliphatic hydrocarbon group in which one or more —$CH_2$— are replaced by —O— or —CO— include a methoxyethyl group, an ethoxyethyl group, a propoxyethyl group, a butoxyethyl group, an acetyloxyethyl group, and the following groups:

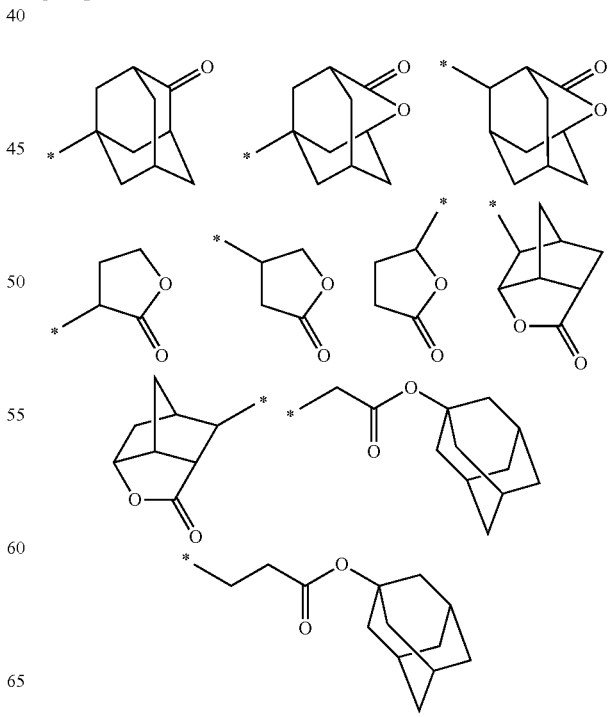

-continued

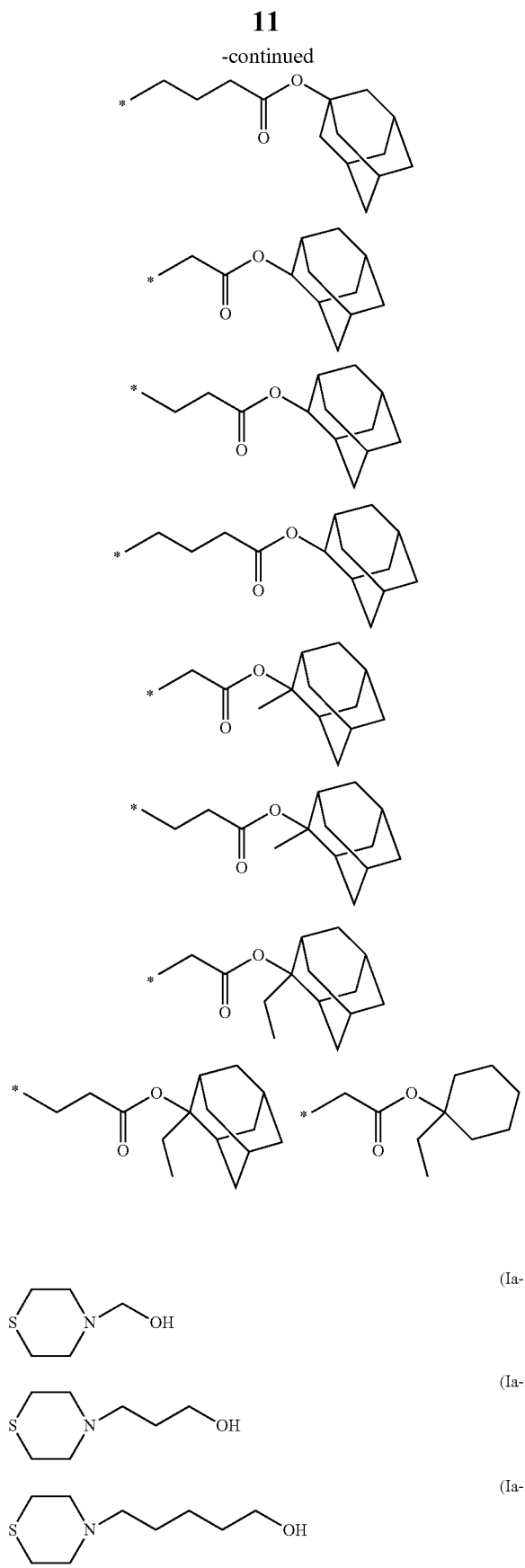

-continued

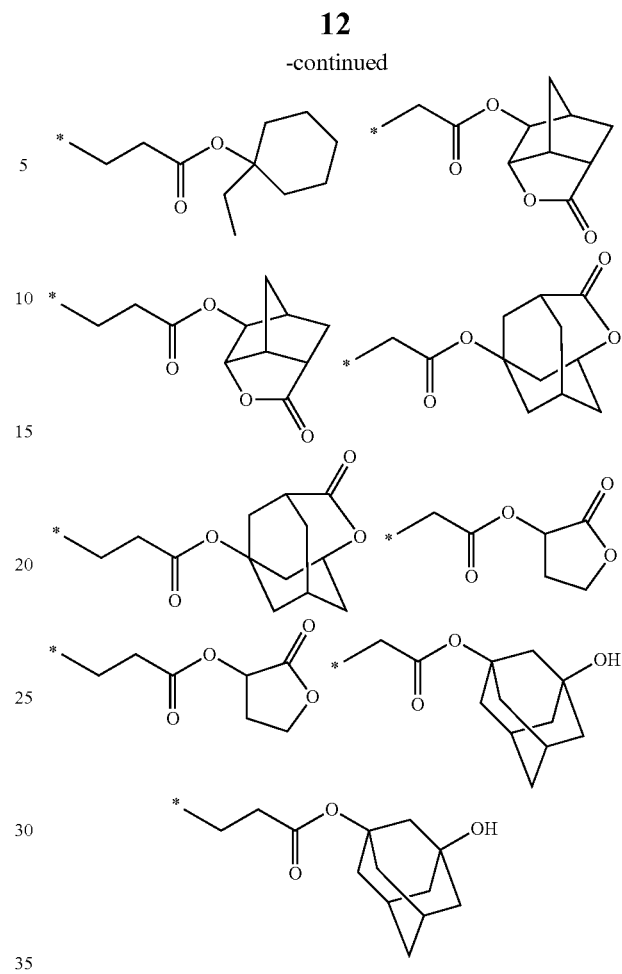

The compound (I-b) wherein $R^1$ is a C1-C20 alkyl group is preferable from the viewpoint of easy production of the compound (I-b), and the compound (I-b) wherein $R^1$ is a C4-C8 alkyl group is more preferable, and the compound (I-b) wherein $R^1$ is a tert-butyl group or a tert-amyl group (a 1,1-dimethylpropyl group) is more preferable.

In the formula (I-b), n is preferably 0.

The compound (I-b) wherein $R^1$ is a C4-C8 alkyl group and n is 0 is preferable, and the compound (I-b) wherein $R^1$ is a tert-butyl group or a tert-amyl group and n is 0 is more preferable.

Specific examples of the compound (I-a) include the compounds represented by the following formulae (Ia-1) to (Ia-41).

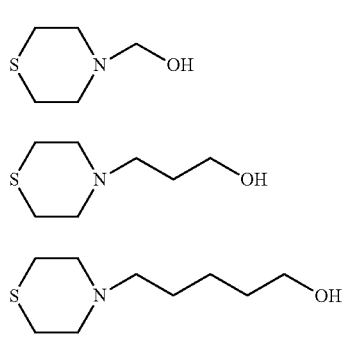

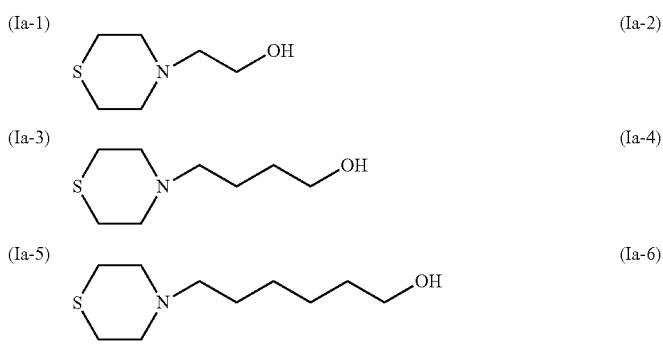

-continued (Ia-7), (Ia-8), (Ia-9), (Ia-10), (Ia-11), (Ia-12), (Ia-13), (Ia-14), (Ia-15), (Ia-16), (Ia-17), (Ia-18), (Ia-19), (Ia-20), (Ia-21), (Ia-22), (Ia-23), (Ia-24), (Ia-25), (Ia-26), (Ia-27), (Ia-28), (Ia-29), (Ia-30)

Specific examples of the compound (I-b) include the compounds represented by the following formulae (Ib-1) to (Ib-74).

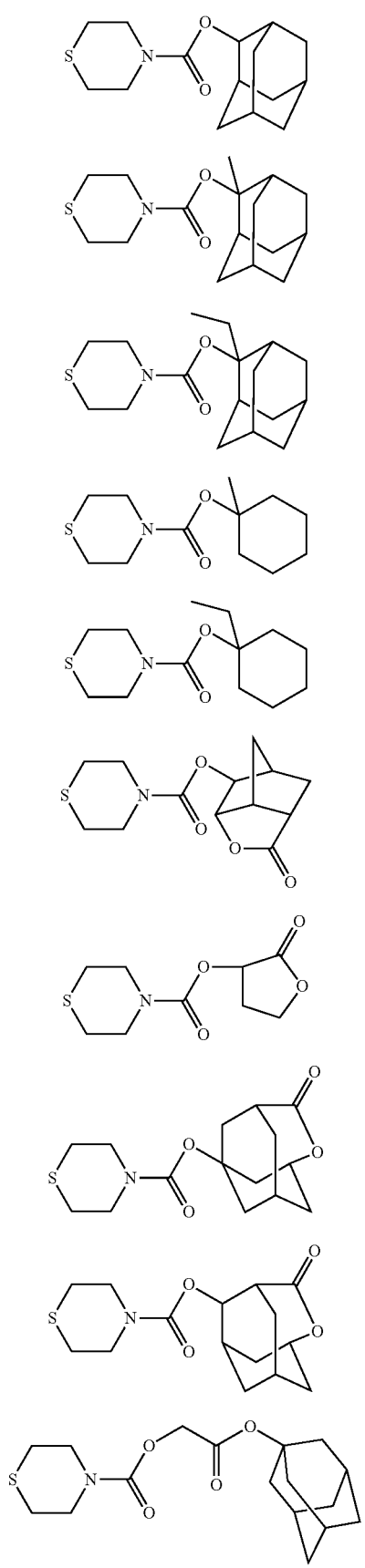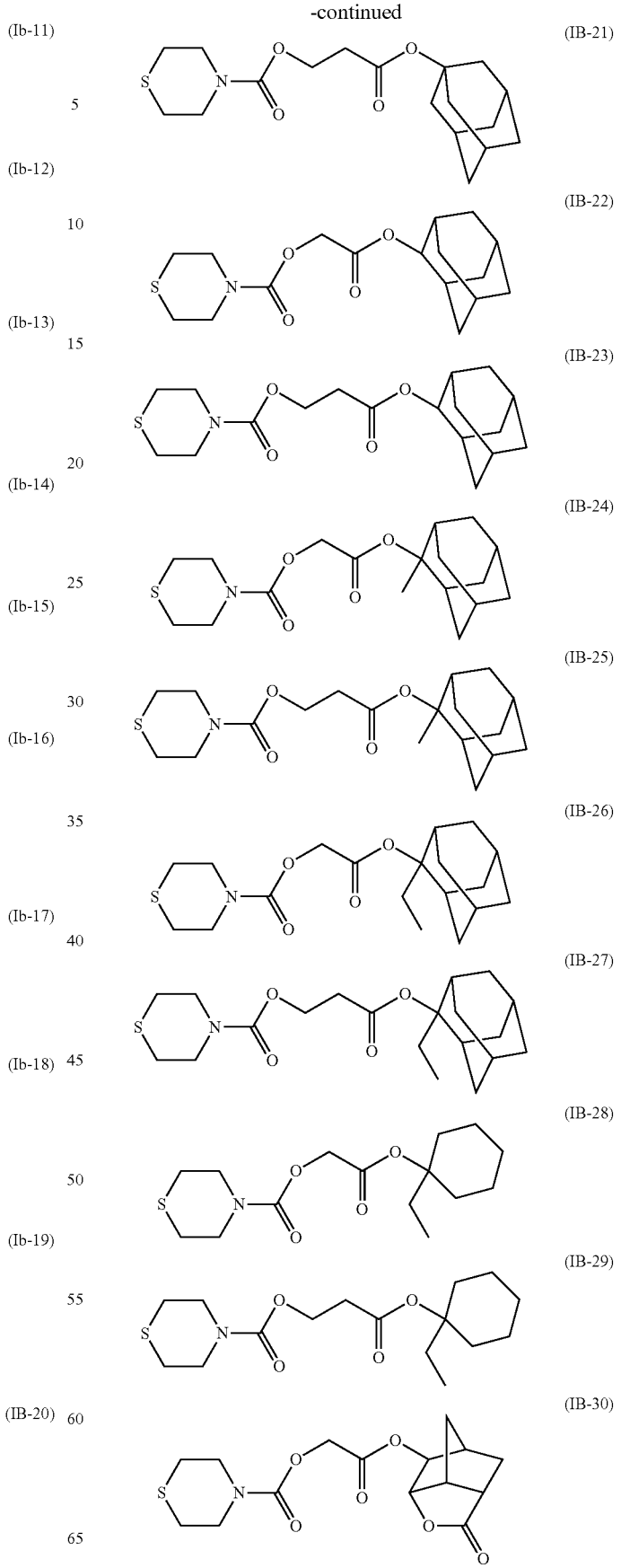

-continued
(IB-31)
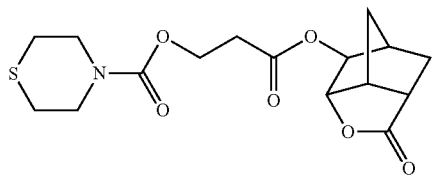
(IB-32)
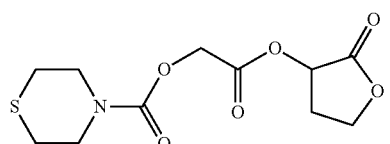
(IB-32)
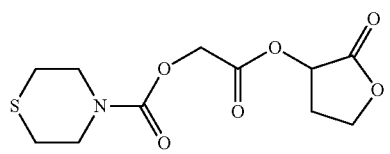
(IB-33)
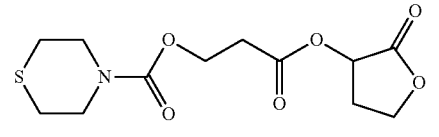
(IB-34)
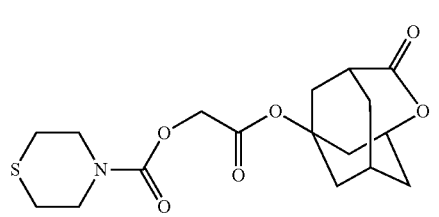
(IB-35)
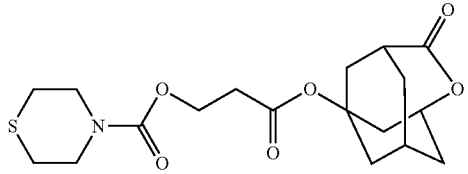
(IB-36)
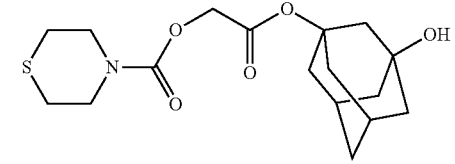
(IB-37)
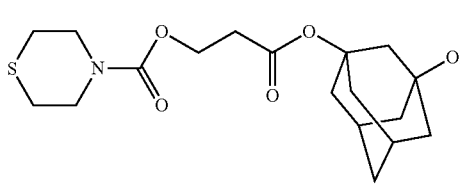
(IB-38)
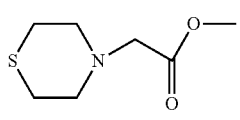
-continued
(IB-39)
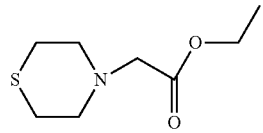
(IB-40)
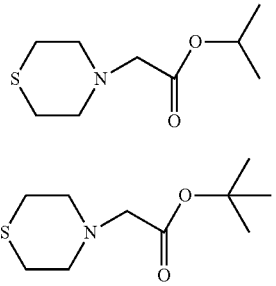
(IB-41)
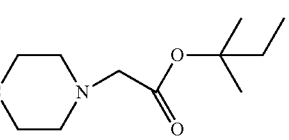
(IB-42)
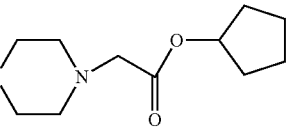
(IB-43)
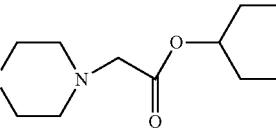
(IB-44)
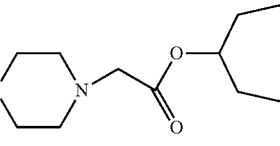
(IB-45)
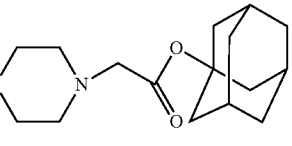
(IB-46)
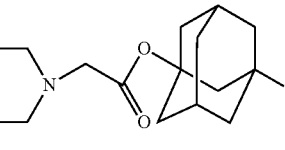
(IB-47)
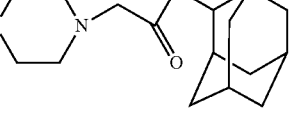
(IB-48)
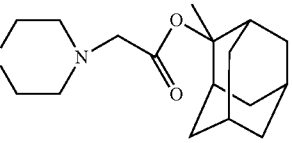
(IB-49)

-continued
(IB-50)
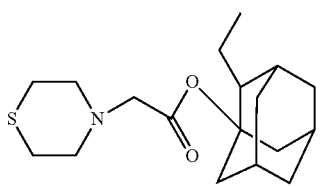
(IB-51)
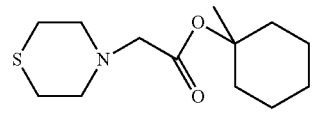
(IB-52)
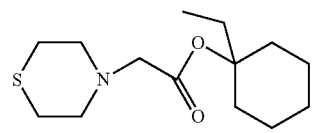
(IB-53)
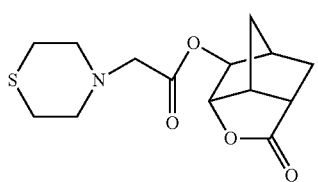
(IB-54)
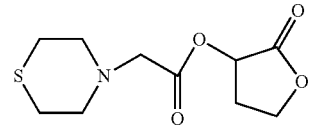
(IB-55)
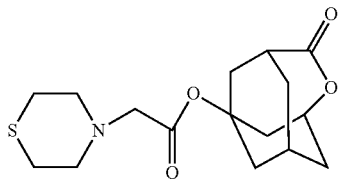
(IB-56)
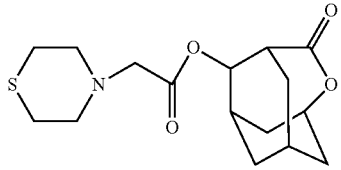
(Ib-57)
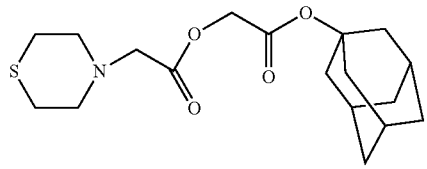
(Ib-58)
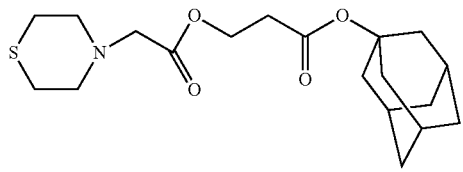
-continued
(Ib-59)
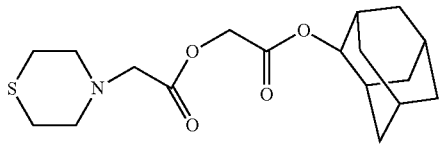
(Ib-60)
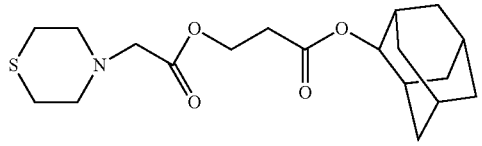
(Ib-61)
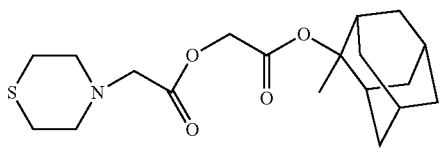
(Ib-62)
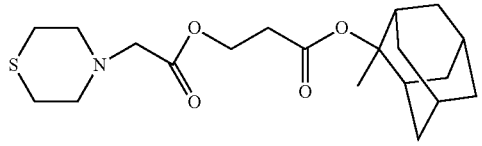
(Ib-63)
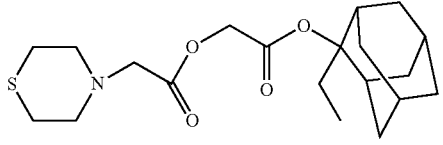
(Ib-64)
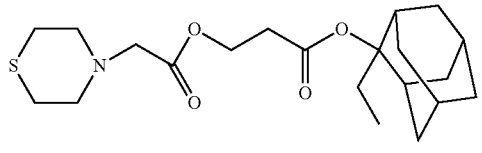
(Ib-65)
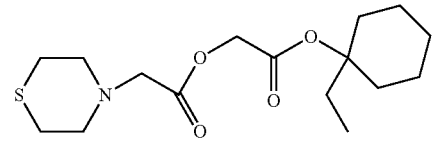
(Ib-66)
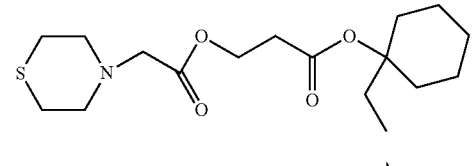
(Ib-67)
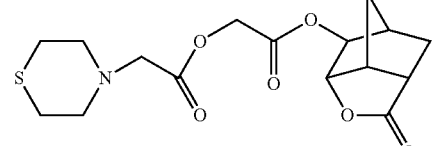
(Ib-68)
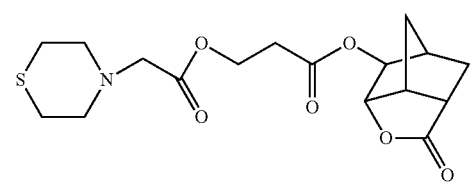

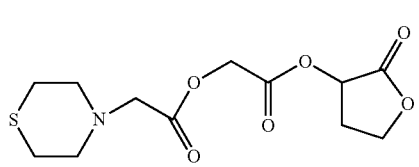

(Ib-69)

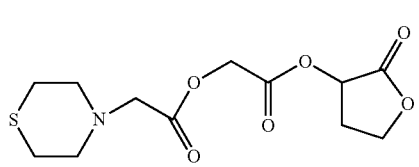

(Ib-70)

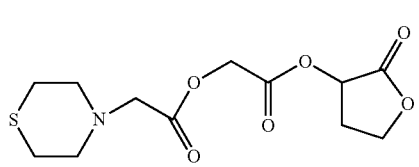

(Ib-71)

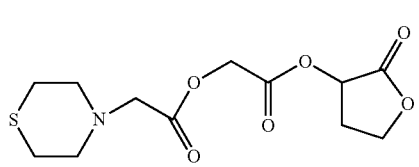

(Ib-72)

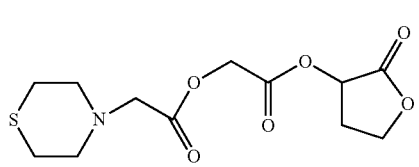

(Ib-73)

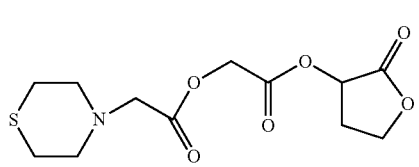

(Ib-74)

Among them, preferred are the compounds represented by the formulae (Ia-8), (Ia-10), (Ia-12), (Ia-22), (Ia-23), (Ia-27), (Ib-41), (Ib-42), (Ib-47), (Ib-49), (Ib-50), (Ib-51), (Ib-52) and (Ib-53), and more preferred are the compounds represented by the formulae (Ia-8), (Ia-10), (Ia-12), (Ia-27), (Ib-4), (Ib-47), (Ib-49), (Ib-50), (Ib-51) and (Ib-52), and still more preferred are the compounds represented by the formulae (Ia-8), (Ia-10), (Ia-12), (Ib-4), (Ib-47), (Ib-49) and (Ib-50), and especially preferred are the compounds represented by the formulae (Ia-8), (Ia-12) and (Ib-4).

The compound (Ia-1) can be produced by reacting a compound represented by the formula (I-a-1) with a compound represented by the formula (I-a-2) in the presence of a basic catalyst such as N-methylpyrrolidine in a solvent such as methyl isobutyl ketone.

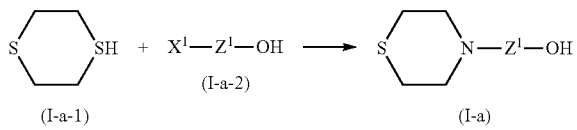

(I-a-1)     (I-a-2)     (I-a)

wherein $Z^1$ is the same as defined above, and $X^1$ represents a halogen atom.

Examples of the halogen atom represented by $X^1$ include a fluorine atom, a chlorine atom, a bromine atom and an iodine atom, and a chlorine atom is preferable.

The compound represented by the formula (I-a-1) is commercially available. Examples of the commercially available compound represented by the formula (I-a-2) include 8-chlorooctanol and 12-bromododecanol.

The compound (I-b) wherein n is 1 can be produced by reacting a compound represented by the formula (I-b-1) with a compound represented by the formula (I-b-2) in the presence of a basic catalyst such as N-methylpyrrolidine in a solvent such as methyl isobutyl ketone.

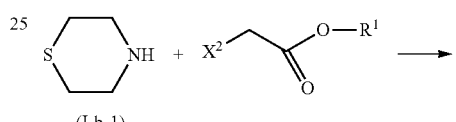

(I-b-1)     (I-b-2)

(I-b)

wherein $R^1$ is the same as defined above, and $X^2$ represents a halogen atom.

Examples of the halogen atom represented by $X^2$ include a fluorine atom, a chlorine atom, a bromine atom and an iodine atom, and a chlorine atom is preferable.

The compound represented by the formula (I-b-1) is commercially available. Examples of the commercially available compound represented by the formula (I-b-2) include the following.

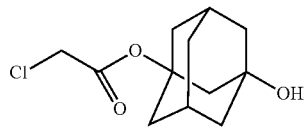 [SMILES: O=C(CCl)OC12CC3CC(CC(O)(C3)C1)C2]

The compound (I-b) wherein n is 0 can be produced by reacting a compound represented by the formula (IB-b-1) with a compound represented by the formula (IB-b-2) in the presence of a basic catalyst such as triethylamine in a solvent such as tetrahydrofuran.

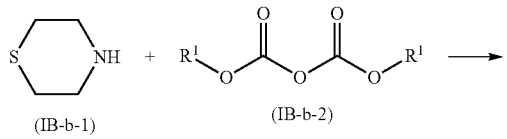

(IB-b-1)     (IB-b-2)

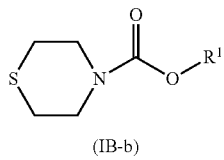

(IB-b)

wherein R¹ is the same as defined above.

The compound represented by the formula (IB-b-1) is commercially available. Examples of the commercially available compound represented by the formula (IB-b-2) include the following.

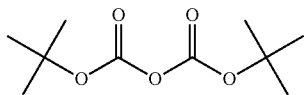

The content of component (X) is usually 5% by mass or less based on sum of solid component, preferably 4% by mass or less, and more preferably 3% by mass or less. The content of component (X) is usually 0.01% by mass or more, and preferably 0.05% by mass or more. In this specification, "solid component" means components other than solvent in the photoresist composition.

Next, component (A), that is, RESIN (A), will be illustrated.

RESIN (A) has an acid-labile group, and is insoluble or poorly soluble in an aqueous alkali solution, and RESIN (A) is capable of being soluble in an aqueous alkali solution by the action of an acid.

In the photoresist composition of the present invention, an acid is generated from component (B) contained therein by exposure.

The acid catalytically acts against the acid-labile group in RESIN (A) to cleave the acid-labile group, and RESIN (A) becomes soluble in an aqueous alkali solution. In this specification, "an acid-labile group" means a group capable of being eliminated by the action of an acid.

Examples of the acid-labile group include a group represented by the formula (1):

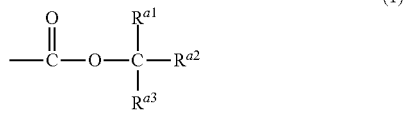

wherein $R^{a1}$, $R^{a2}$ and $R^{a3}$ independently each represent a C1-C8 alkyl group or a C3-C20 alicyclic hydrocarbon group, and $R^{a1}$ and $R^{a2}$ can be bonded each other to form a C2-C20 divalent hydrocarbon group which forms a ring together with the carbon atom to which they are bonded, and one or more —CH$_2$— in the C1-C8 alkyl group, the C3-C20 alicyclic hydrocarbon group and the C3-C20 divalent hydrocarbon group can be replaced by —O—, —S— or —CO—.

Examples of the C1-C8 alkyl group include a methyl group, an ethyl group, a propyl group, an isopropyl group, a butyl group, a pentyl group, a hexyl group, a heptyl group and an octyl group.

The alicyclic hydrocarbon group may be monocyclic or polycyclic, and may be saturated or non-aromatic unsaturated. Examples thereof include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings:

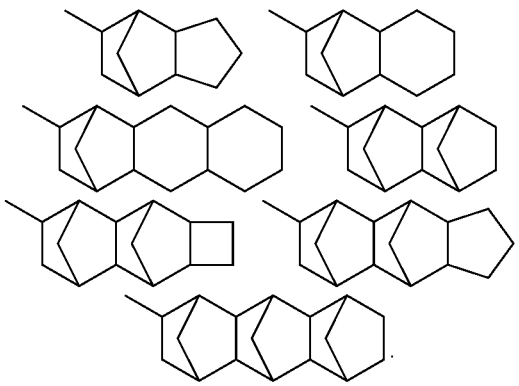

The alicyclic hydrocarbon group is preferably a saturated cyclic hydrocarbon group, and preferably has 5 to 16 carbon atoms.

Examples of the ring formed by bonding $R^{a1}$ and $R^{a2}$ each other include the following groups and the ring preferably has 3 to 12 carbon atoms.

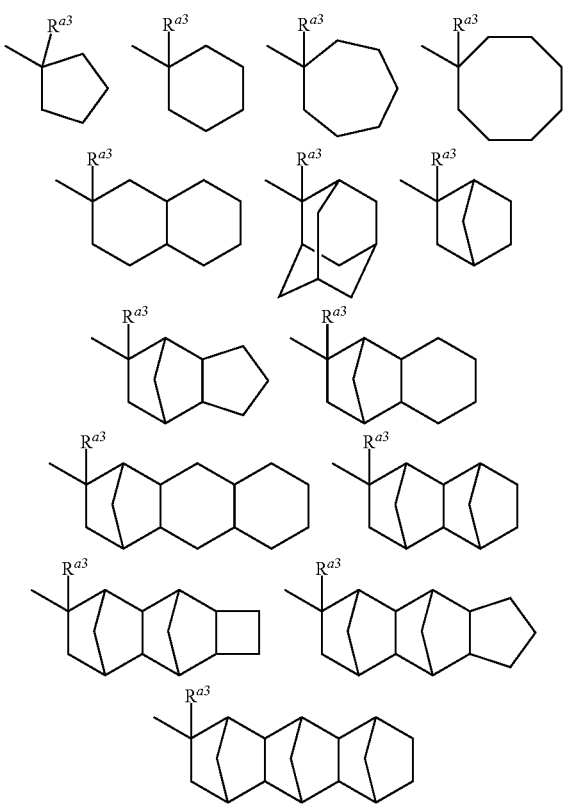

wherein $R^{a3}$ is the same as defined above.

The group represented by the formula (10) wherein $R^{a1}$, $R^{a2}$ and $R^{a3}$ independently each represent a C1-C8 alkyl group such as a tert-butyl group, the group represented by the formula (10) wherein $R^{a1}$ and $R^{a2}$ are bonded each other to form an adamantyl ring and $R^{a3}$ is a C1-C8 alkyl group such as a 2-alkyl-2-adamantyl group, and the group represented by the formula (10) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

Examples of the acid-labile group include a group represented by the formula (2):

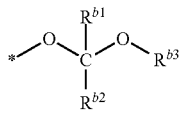

wherein $R^{b1}$ and $R^{b2}$ independently each represent a hydrogen atom or a C1-C12 hydrocarbon group, and $R^{b3}$ represents a C1-C20 hydrocarbon group, and $R^{b2}$ and $R^{b3}$ can be bonded each other to form a C2-C20 divalent hydrocarbon group which forms a ring together with the carbon atom and the oxygen atom to which they are bonded, and one or more —$CH_2$— in the hydrocarbon group and the divalent hydrocarbon group can be replaced by —O—, —S— or —CO—.

The group represented by the formula (20) has an acetal structure.

Examples of the hydrocarbon group include an aliphatic hydrocarbon group, an alicyclic hydrocarbon group and an aromatic hydrocarbon group. Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenathryl group, a 2,6-diethylphenyl group and a 2-methyl-6-ethylphenyl group.

It is preferred that at least one of $R^{b1}$ and $R^{b2}$ is a hydrogen atom.

Examples of the group represented by the formula (20) include the following.

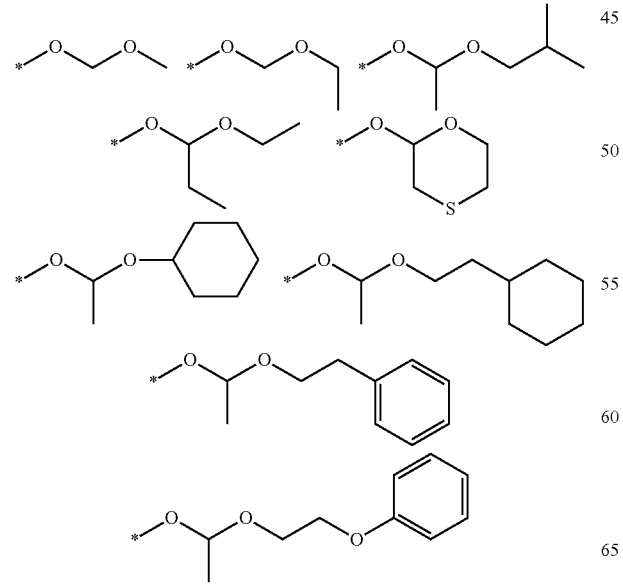

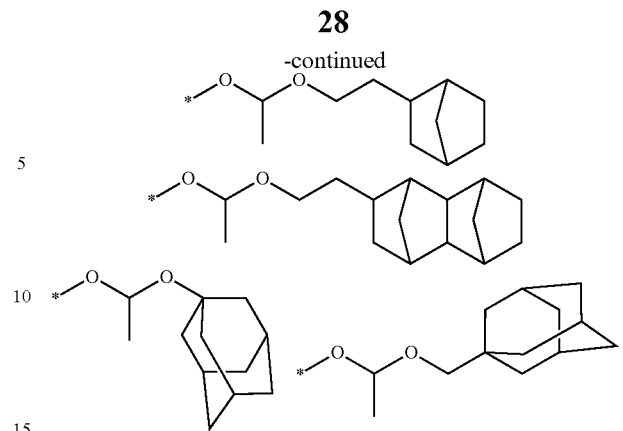

The compound having an acid-labile group is preferably a monomer having an acid-labile group in its side chain and a carbon-carbon double bond, and is more preferably an acrylate monomer having an acid-labile group in its side chain or a methacryalte monomer having an acid-labile group in its side chain.

A monomer having the group represented by the formula (10) or (20) in its side chain and a carbon-carbon double bond is preferable, and an acrylate monomer having the group represented by the formula (10) in its side chain or a methacryalte monomer having the group represented by the formula (10) in its side chain is more preferable.

An acrylate monomer having the group represented by the formula (10) in which $R^{a1}$ and $R^{a2}$ are bonded each other to form a C5-C20 alicycle together with the carbon atom to which they are bonded in its side chain or a methacryalte monomer having the group represented by the formula (10) in which $R^{a1}$ and $R^{a2}$ are bonded each other to form a C5-C20 alicycle together with the carbon atom to which they are bonded in its side chain is especially preferable.

When the photoresist composition contains a resin derived from a monomer having a bulky structure such as a saturated alicyclic hydrocarbon group, the photoresist composition having excellent resolution tends to be obtained.

Preferable examples of the structural unit derived from the monomer having an acid-labile group include the structural units represented by the formulae (a1-1) and (a1-2):

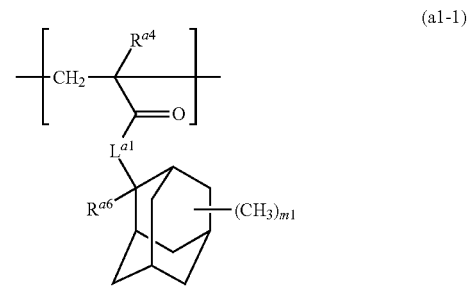
(a1-1)

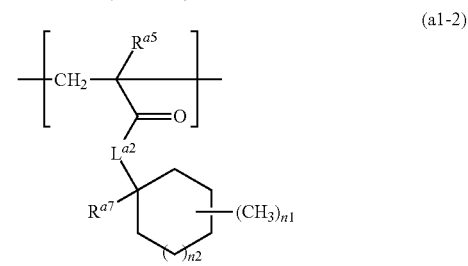
(a1-2)

wherein $R^{a4}$ and $R^{a5}$ each independently represents a hydrogen atom or a methyl group, $R^{a6}$ and $R^{a7}$ each independently represents a C1-C10 aliphatic hydrocarbon group, $L^{a1}$ and $L^{a2}$ each independently represents *—O— or *—O—

$(CH_2)_{k1}$—CO—O— in which * represents a binding position to —CO—, and k1 represents an integer of 1 to 7, and m1 represents an integer of 0 to 14, n1 represents an integer of 0 to 10, and n2 represents an integer of 0 to 3.

$L^{a1}$ is preferably *—O— or *—O—$(CH_2)_{f1}$—CO—O— in which * represents a binding position to —CO—, and f1 represents an integer of 1 to 4, and is more preferably *—O— or *—O—$CH_2$—CO—O—, and is especially preferably *—O—. $L^{a2}$ is preferably *—O— or *—O—$(CH_2)_{f1}$—CO—O— in which * represents a binding position to —CO—, and f1 is the same as defined above, and is more preferably *—O— or *—O—$CH_2$—CO—O—, and is especially preferably *—O—.

$R^{a4}$ and $R^{a5}$ are preferably methyl groups.

The aliphatic hydrocarbon group represented by $R^{a6}$ and $R^{a7}$ is preferably C1-C8 alkyl group or C3-C10 alicyclic hydrocarbon group. It is preferred that $R^{a6}$ and $R^{a7}$ independently each represent C1-C8 alkyl group or C3-C8 alicyclic hydrocarbon group, and it is more preferred that $R^{a6}$ and $R^{a7}$ independently each represent C1-C6 alkyl group or C3-C6 alicyclic hydrocarbon group. The alicyclic hydrocarbon group is preferably a saturated aliphatic cyclic hydrocarbon group. Examples of the aliphatic hydrocarbon group include a methyl group, an ethyl group, a propyl group, an isopropyl group, a tert-butyl group, a 2,2-dimethylethyl group, a propyl group, a 1-methylpropyl group, a 2,2-dimethylpropyl group, a 1-ethylpropyl group, a butyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the alicyclic hydrocarbon group include a cyloheptyl group, a methylcyloheptyl group, a cyclohexyl group, a methylcyclohexyl group, a dimethylcyclohexyl group, a norbornyl group and a methylnorbornyl group.

In the formula (a1-1), m1 is preferably an integer of 0 to 3, and is more preferably 0 or 1. In the formula (a1-2), n1 is preferably an integer of 0 to 3, and is more preferably 0 or 1, and n2 is preferably 0, 1 or 2, and more preferably 0 or 1. It is preferred that k1 is an integer of 1 to 4, and it is more preferred that k1 is 1.

Examples of the monomer giving the structural unit represented by the formula (a1-1) include the monomers described in JP 2010-204646 A. Among them, preferred are the monomers represented by the formulae (a1-1-1) to (a1-1-8), and more preferred are the monomers represented by the formulae (a1-1-1) to (a1-1-3).

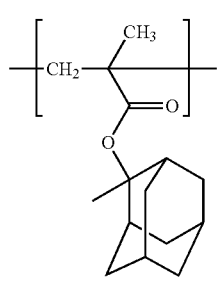

(a1-1-1)

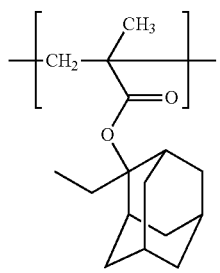

(a1-1-2)

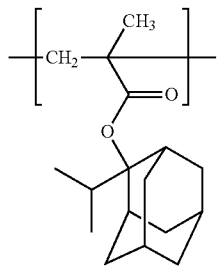

(a1-1-3)

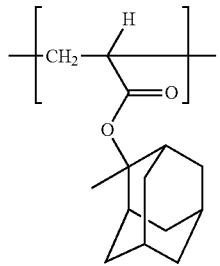

(a1-1-4)

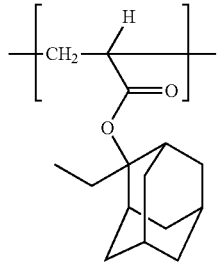

(a1-1-5)

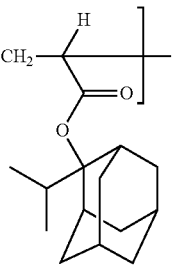

(a1-1-6)

(a1-1-7)

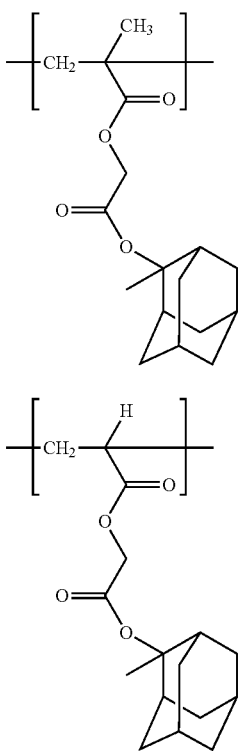

(a1-1-8)

Examples of the monomer giving the structural unit represented by the formula (a1-2) include 1-ethylcyclopentan-1-yl acrylate, 1-ethylcyclopentan-1-yl methacrylate, 1-ethylcyclohexan-1-yl acrylate, 1-ethylcyclohexan-1-yl methacrylate, 1-ethylcycloheptan-1-yl acrylate, 1-ethylcycloheptan-1-yl methacrylate, 1-methylcyclopentan-1-yl acrylate, 1-methylcyclopentan-1-yl methacrylate, 1-isopropylcyclopentan-1-yl acrylate and 1-isopropylcyclopentan-1-yl methacrylate. Among them, preferred are the monomers represented by the formulae (a1-2-1) to (a1-2-6), and more preferred are the monomers represented by the formulae (a1-2-3) and (a1-2-4), and still more preferred is the monomer represented by the formula (a1-2-3).

(a1-2-1)

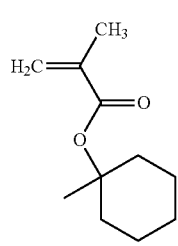

(a1-2-2)

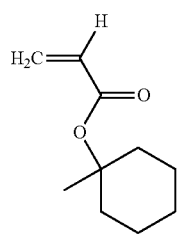

(a1-2-3)

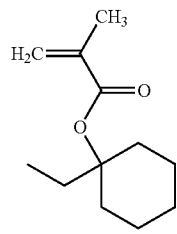

(a1-2-4)

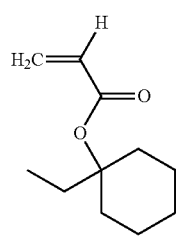

(a1-2-5)

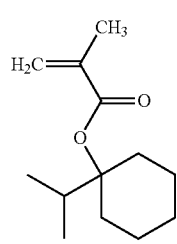

(a1-2-6)

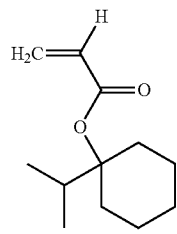

The content of the structural unit represented by the formula (a1-1) or (a1-2) in RESIN (A) is usually 10 to 95% by mole, preferably 15 to 90% by mole and more preferably 20 to 85% by mole and especially preferably 20 to 60% by mole based on 100% by mole of all the structural units of RESIN (A).

The content of the structural unit represented by the formula (a1-1) or (a1-2) in RESIN (A) can be adjusted by adjusting the amount of the monomer giving the structural unit represented by the formula (a1-1) or (a1-2) based on the total amount of the monomers used for producing RESIN (A). Specifically, the amount of the monomer giving the structural unit represented by the formula (a1-1) or (a1-2) is usually 10 to 95% by mole, preferably 15 to 90% by mole and more preferably 20 to 85% by mole and especially preferably 20 to 60% by mole based on 100% by mole of all the monomers used for producing RESIN (A).

The content of the structural unit having an adamantyl group, especially the structural unit represented by the formula (a1-1) is preferably 15% by mole or more based on 100% by mole of all the structural units of RESIN (A) from the viewpoint of dry-etching resistance of the photoresist composition.

Other examples of the monomer having an acid-labile group include a monomer represented by the formula (a1-3):

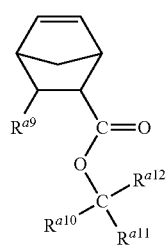

(a1-3)

wherein $R^{a9}$ represents a hydrogen atom, a C1-C3 aliphatic hydrocarbon group which can have one or more hydroxyl groups (—OH), a carboxyl group (—COOH), a cyano group or a —COOR$^{a13}$ group in which $R^{a13}$ represents a C1-C8 aliphatic hydrocarbon group, and the aliphatic hydrocarbon group can have one or more hydroxyl groups, and one or more —CH$_2$— in the aliphatic hydrocarbon group can be replaced by —O— or —CO—, $R^{a10}$, $R^{a11}$ and $R^{a12}$ each independently represent a C1-C12 aliphatic hydrocarbon group, and $R^{a10}$ and $R^{a11}$ can be bonded each other to form a ring together with the carbon atom to which $R^{a10}$ and $R^{a11}$ are bonded, and the aliphatic hydrocarbon group can have one or more hydroxyl groups, and one or more —CH$_2$— in the aliphatic hydrocarbon group can be replaced by —O— or —CO—.

When RESIN (A) has a structural unit derived from the monomer represented by the formula (a1-3), the photoresist composition having excellent resolution and higher dry-etching resistance tends to be obtained.

Examples of the C1-C3 aliphatic hydrocarbon group which can have one or more hydroxyl groups include a C1-C3 alkyl group which can have one or more hydroxyl groups such as a methyl group, an ethyl group, a propyl group, a hydroxymethyl group and a 2-hydroxyethyl group. Examples of the aliphatic hydrocarbon group represented by $R^{a10}$, $R^{a11}$ and $R^{a12}$ include a chain hydrocarbon group such as an alkyl group and an alicyclic hydrocarbon group and examples thereof include the same as described above. Examples of $R^{a10}$, $R^{a11}$ and $R^{a12}$ include a methyl group, an ethyl group, a cyclohexyl group, a methylcyclohexyl group, a hydroxycyclohexyl group, an oxocyclohexyl group and an adamantyl group.

Examples of the ring formed by bonding $R^{a10}$ and $R^{a11}$ each other together with the carbon atom to which $R^{a10}$ and $R^{a11}$ are bonded include a cyclohexane ring and an adamantane ring.

Examples of $R^{a13}$ include a methyl group, an ethyl group, a propyl group, a 2-oxo-oxolan-3-yl group and a 2-oxo-oxolan-4-yl group.

Examples of the monomer represented by the formula (a1-3) include the monomers described in JP 2010-204646 A. Among them, preferred are the monomers represented by the formulae (a1-3-1) to (a1-3-4), and more preferred are the monomers represented by the formulae (a1-3-2) and (a1-3-4), and still more preferred is the monomer represented by the formula (a1-3-2).

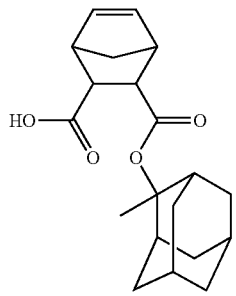

(a1-3-1)

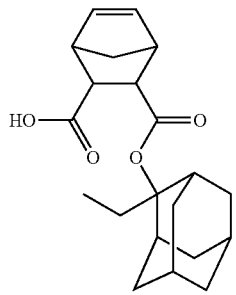

(a1-3-2)

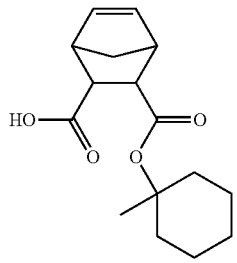

(a1-3-3)

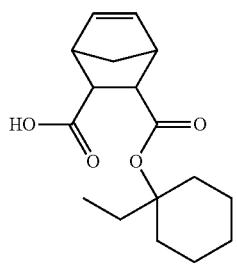

(a1-3-4)

When RESIN (A) contains the structural unit derived form the monomer represented by the formula (a1-3), the content of the structural unit derived from the monomer represented by the formula (a1-3) is usually 10 to 95% by mole and preferably 15 to 90% by mole and more preferably 20 to 85% by mole based on total molar of all the structural units of RESIN (A).

Other examples of the compound having an acid-labile group include a monomer represented by the formula (a1-4):

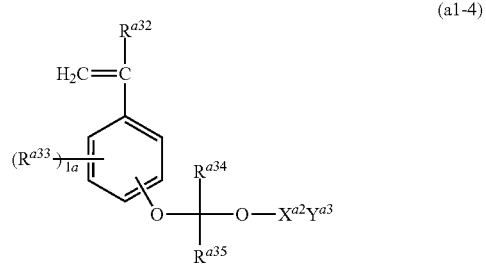

(a1-4)

wherein $R^{a32}$ represents a hydrogen atom, a halogen atom, a C1-C6 alkyl group or a C1-C6 halogenated alkyl group, $R^{a33}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, 1a represents an integer of 0 to 4, $R^{a34}$ and $R^{a35}$ each independently represent a hydrogen atom or a C1-C12 hydrocarbon group, $X^{a2}$ represents a single bond or a C1-C17 divalent saturated hydrocarbon group in which one or more —CH$_2$— can be replaced by —O—, —CO—, —S—, —SO$_2$— or —N(R$^c$)— wherein R$^c$ represents a hydrogen atom or a C1-C6 alkyl group, and $Y^{a3}$ represents a C1-C18 hydrocarbon group, and the C1-C17 divalent saturated hydrocarbon group and the C1-C18 hydrocarbon group can have one or more substituents selected from the group consisting of a halogen atom, a hydroxyl group, a C1-C6 alkyl group, a C1-C6 alkoxy group, a C2-C4 acyl group and a C2-C4 acyloxy group.

Examples of the halogen atom include a fluorine atom, a chlorine atom, a bromine atom and an iodine atom.

Examples of the C1-C6 alkyl group include the same as described above, and a C1-C4 alkyl group is preferable and a C1-C2 alkyl group is more preferable and a methyl group is especially preferable.

Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group, a perfluorohexyl group, a perchloromethyl group, a perbromomethyl group and a periodomethyl group.

Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable.

Examples of the C2-C4 acyl group include an acetyl group, a propionyl group and a butyryl group, and examples of the C2-C4 acyloxy group include an acetyloxy group, a propionyloxy group and a butyryloxy group.

Examples of the hydrocarbon group include the chain aliphatic hydrocarbon group described above, the alicyclic hydrocarbon group described above, and the groups formed by combining these groups such as 2-alkyl-2-adamantyl group and 1-(1-adamantyl)-1-alkyl group, and the aromatic hydrocarbon group.

Preferable examples of the hydrocarbon group represented by $R^{a34}$ and $R^{a35}$ include an isopropyl group, a butyl group, a sec-butyl group, a tert-butyl group, a pentyl group, a hexyl group, an octyl group, a 2-ethylhexyl group, a cyclohexyl group, an adamantyl group, a 2-alkyl-2-adamantyl group, a 1-(1-adamantyl)-1-alkyl group and an isobornyl group.

Preferable examples of the substituents in the C1-C17 divalent saturated hydrocarbon group and the C1-C18 hydrocarbon group is a hydroxyl group.

Examples of the C1-C17 divalent aliphatic hydrocarbon group include a C1-C17 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group.

Examples of the monomer represented by the formula (a1-4) include the monomers described in JP 2010-204646 A. Among them, preferred are the monomers represented by the formulae (a1-4-1) to (a1-4-7), and more preferred are the monomers represented by the formulae (a1-4-1) and (a1-4-5).

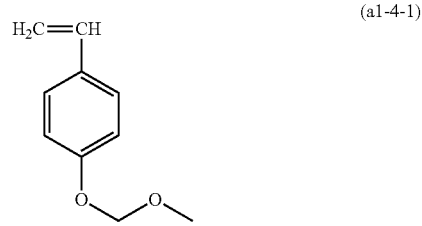

(a1-4-1)

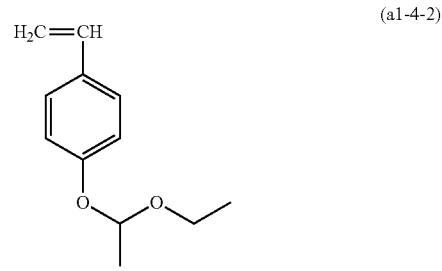

(a1-4-2)

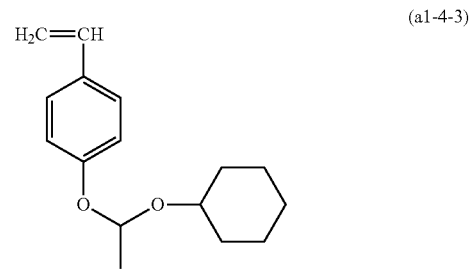

(a1-4-3)

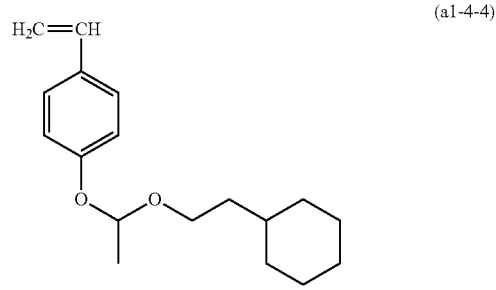

(a1-4-4)

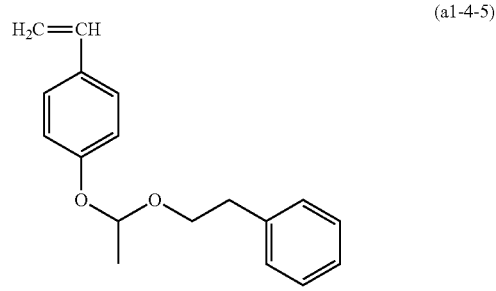

(a1-4-5)

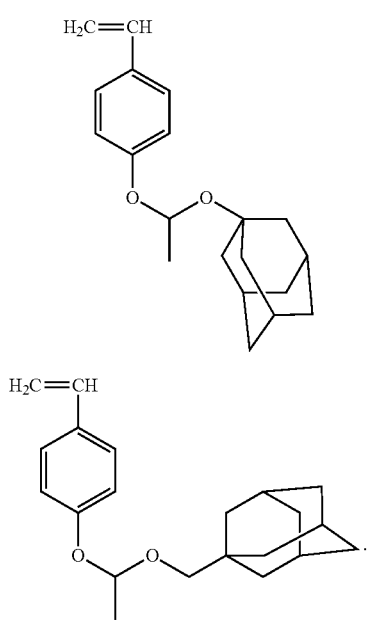

When RESIN (A) contains the structural unit derived form the monomer represented by the formula (a1-4), the content of the structural unit derived from the monomer represented by the formula (a1-4) is usually 10 to 95% by mole and preferably 15 to 90% by mole and more preferably 20 to 85% by mole based on total molar of all the structural units of RESIN (A).

Other examples of the monomer having an acid-labile group include a monomer represented by the formula (a1-5):

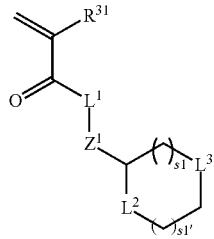

wherein $R^{31}$ represents a hydrogen atom, a halogen atom, a C1-C6 alkyl group which may be substituted with a halogen atom, $L^1$ represents —O—, —S— or *—O—$(CH_2)_{k1}$—CO—O—, k1 represents an integer of 1 to 7, * represents a binding position to —CO—, $L^2$ and $L^3$ independently each represent —O— or —S—, $Z^1$ represents a single bond or a C1-C6 alkylene group in which one or more —$CH_2$— may be replaced by —O— or —CO—, s1 and s1' independently each represent an integer of 0 to 4.

Examples of the halogen atom include a fluorine atom, a chlorine atom and a bromine atom.

Examples of the C1-C6 alkyl group which may be substituted with a halogen atom include a methyl group, an ethyl group, a propyl group, an isopropyl group, a butyl group, an isobutyl group, a sec-butyl group, a tert-butyl group, a pentyl group, a hexyl group, a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group, a perfluorohexyl group, a perchloromethyl group, a perbromomethyl group and a periodomethyl group, and a C1-C4 alkyl group is preferable and a C1-C2 alkyl group is more preferable and a methyl group is especially preferable.

$R^{31}$ is preferably a hydrogen atom or a methyl group.

$L^1$ is preferably —O—.

It is preferred that one of $L^2$ and $L^3$ is —O— and the other is —S—.

In the formula (a1-5), s1 is preferably 1 and s1' is preferably 0, 1 or 2.

$Z^1$ is preferably a single bond, *—$(CH_2)_{n4}$—O— or *—$(CH_2)_{n4}$—CO—O— in which n4 represents an integer of 1 to 4, and * represents a binding position to $L^4$, and more preferably a single bond, —$CH_2$—O— or —$CH_2$—CO—O—.

Examples of the monomer represented by the formula (a1-5) include the following.

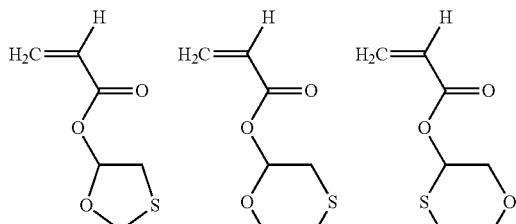

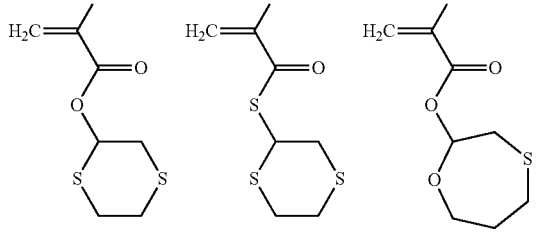

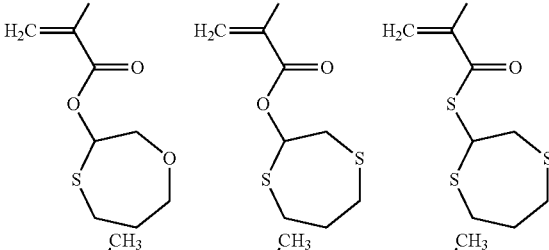

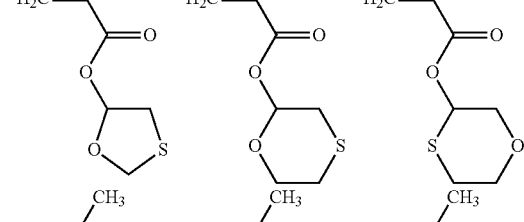

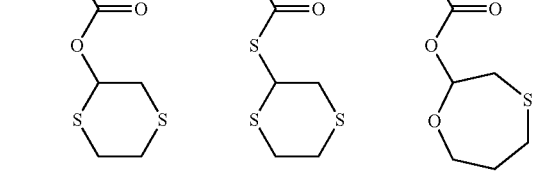

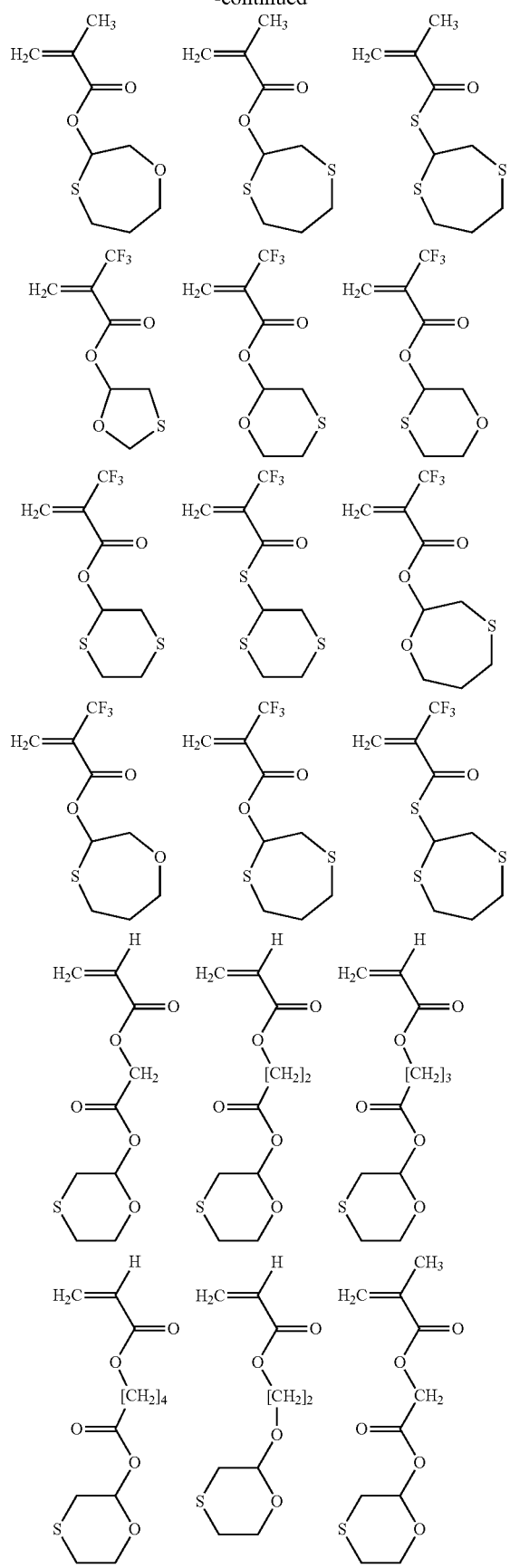
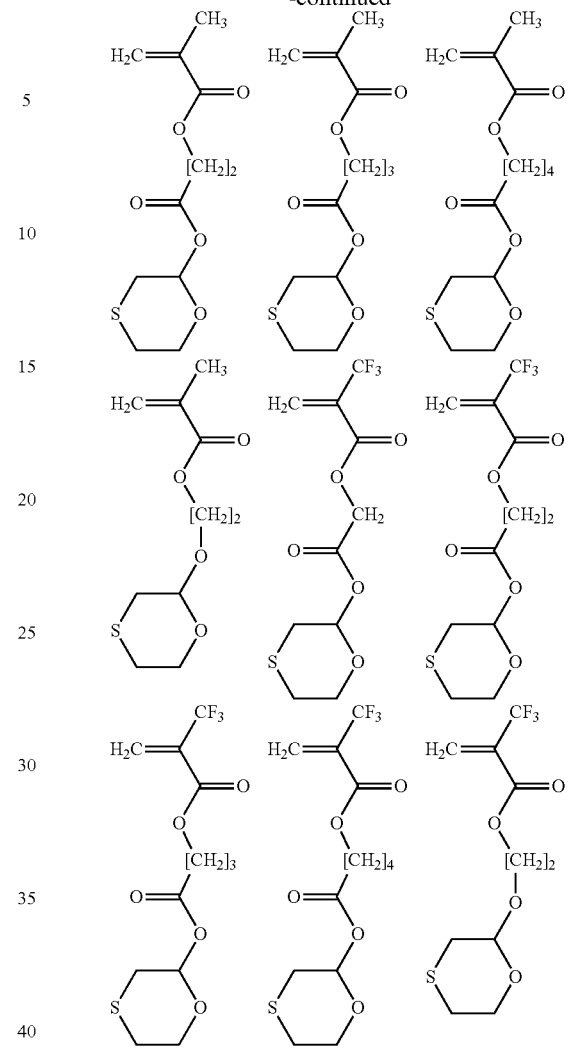

When RESIN (A) contains the structural unit derived form the monomer represented by the formula (a1-5), the content of the structural unit derived from the monomer represented by the formula (a1-5) is usually 1 to 95% by mole and preferably 3 to 90% by mole and more preferably 5 to 85% by mole based on total molar of all the structural units of RESIN (A).

RESIN (A) can have two or more kinds of structural units derived from the monomers having an acid-labile group.

RESIN (A) preferably contains the structural unit derived from the monomer having an acid-labile group and a structural unit derived from the monomer having no acid-labile group. RESIN (A) can have two or more kinds of structural units derived from the monomers having no acid-labile group. When RESIN (A) contains the structural unit derived from the monomer having an acid-labile group and the structural unit derived from the monomer having no acid-labile group, the content of the structural unit derived from the monomer having an acid-labile group is usually 10 to 80% by mole and preferably 20 to 60% by mole based on total molar of all the structural units of RESIN (A).

The monomer having no acid-labile group preferably contains one or more hydroxyl groups or a lactone ring. When the resin contains the structural unit derived from the monomer having no acid-labile group and having one or more hydroxyl groups or a lactone ring, a photoresist composition having good resolution and adhesiveness of photoresist to a substrate tends to be obtained.

Examples of the structural unit derived from the monomer having no acid-labile group and having one or more hydroxyl groups include the structural unit represented by the formula (a2-0):

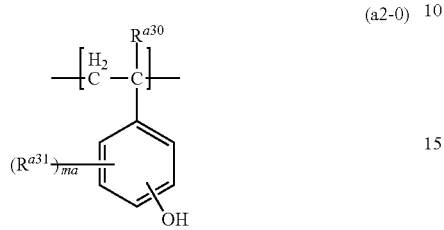

wherein $R^{a30}$ represents a hydrogen atom, a halogen atom, a C1-C6 alkyl group or a C1-C6 halogenated alkyl group, $R^{a31}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, and the structural unit represented by the formula (a2-1):

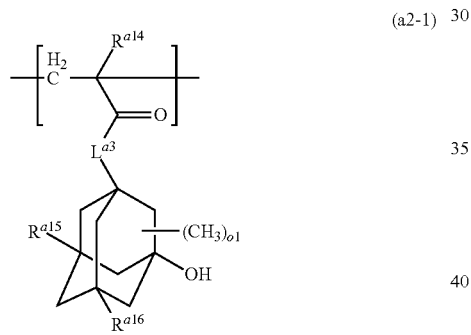

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and of represents an integer of 0 to 10.

When KrF excimer laser (wavelength: 248 nm) lithography system, or a high energy laser such as electron beam and extreme ultraviolet is used as an exposure system, the resin containing the structural unit derived from the monomer represented by the formula (a2-0) is preferable, and when ArF excimer laser (wavelength: 193 nm) is used as an exposure system, the resin containing the structural unit derived from the monomer represented by the formula (a2-1) is preferable.

In the formula (a2-0), examples of the halogen atom include a fluorine atom, examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable. Examples of the C2-C4 acyl group include an acetyl group, a propionyl group and a butyryl group, and examples of the C2-C4 acyloxy group include an acetyloxy group, a propionyloxy group and a butyryloxy group. In the formula (a2-0), ma is preferably 0, 1 or 2, and is more preferably 0 or 1, and especially preferably 0.

RESIN (A) containing the structural unit represented by the formula (a2-0) can be produced, for example, by polymerizing a monomer obtained by protecting a hydroxyl group of the monomer giving the structural unit represented by the formula (a2-0) with a protecting group such as an acetyl group followed by conducting deprotection of the obtained polymer with an acid or a base.

Preferable examples of the structural unit represented by the formula (a2-0) include the following structural units represented by the formulae (a2-0-1) to (a2-0-4).

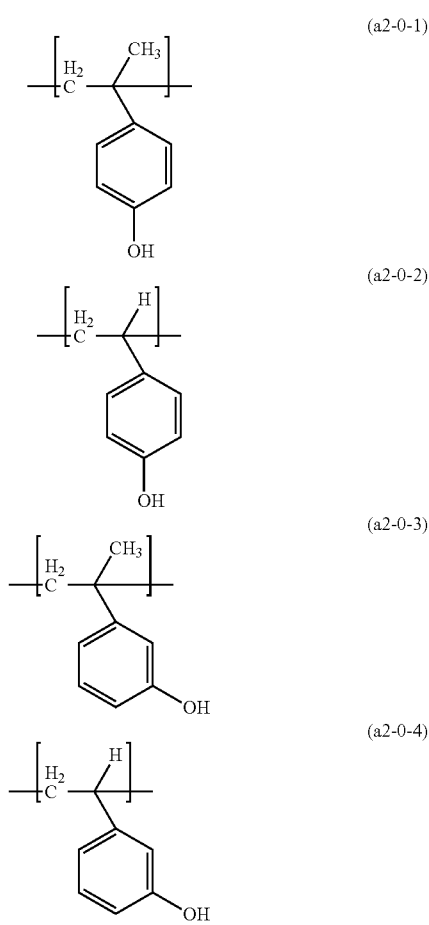

Examples of the monomer giving the structural unit represented by the formula (a2-0) include the monomers described in JP 2010-204634 A.

RESIN (A) containing the structural unit represented by the formula (a2-0) can be produced, for example, by polymerizing a monomer obtained by protecting a hydroxyl group of the monomer giving the structural unit represented by the formula (a2-0) with a protecting group such as an acetyl group followed by conducting deprotection of the obtained polymer with a base.

When RESIN (A) contains the structural unit represented by the formula (a2-0), the content of the structural unit represented by the formula (a2-0) is usually 90% by mole or less and preferably 10 to 85% by mole and more preferably 15 to 80% by mole based on total molar of all the structural units of RESIN (A).

In the formula (a2-1), $R^{a14}$ is preferably a methyl group, $R^{a15}$ is preferably a hydrogen atom, $R^{a16}$ is preferably a hydrogen atom or a hydroxyl group, $L^{a3}$ is preferably *—O— or *—O—$(CH_2)_{f2}$—CO—O— in which * represents a binding position to —CO—, and f2 represents an integer of 1 to 4, and is more preferably *—O— or *—O—$CH_2$—CO—O—, and especially preferably *—O—, and of is preferably 0, 1, 2 or 3 and is more preferably 0 or 1.

Examples of the structural unit represented by the formula (a2-1) include the structural units represented by the formulae (a2-1-1) to (a2-1-6).

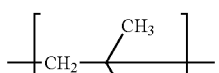

(a2-1-1)

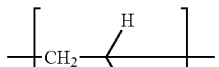

(a2-1-2)

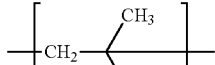

(a2-1-3)

-continued

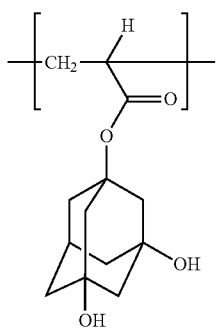

(a2-1-4)

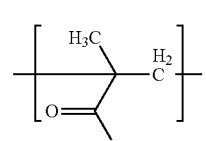

(a2-1-5)

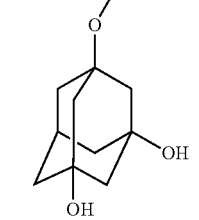

(a2-1-6)

Preferable examples of the structural unit represented by the formula (a2-1) include the structural units represented by the formulae (a2-1-1) to (a2-1-4), and the structural units represented by the formulae (a2-1-1) and (a2-1-3) are more preferable.

Examples of the monomer giving the structural unit represented by the formula (a2-1) include the monomers described in JP 2010-204646 A.

When RESIN (A) contains the structural unit represented by the formula (a2-1), the content of the structural unit represented by the formula (a2-1) is usually 3 to 45% by mole based on total molar of all the structural units of RESIN (A), and preferably 5 to 40% by mole, and more preferably 3 to 30% by mole, and especially preferably 5 to 35% by mole.

Examples of the lactone ring of the monomer having no acid-labile group and a lactone ring include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferable examples of the structural unit derived from the monomer having no acid-labile group and a lactone ring include the structural units represented by the formulae (a3-1), (a3-2) and (a3-3):

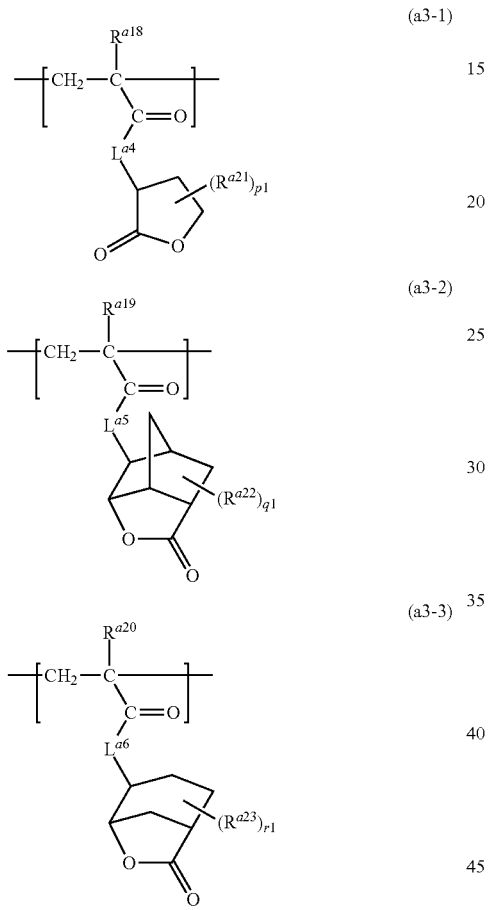

wherein $L^{a4}$, $L^{a5}$ and $L^{a6}$ each independently represent *—O— or *—O—$(CH_2)_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently each represent an integer of 0 to 3.

It is preferred that $L^{a4}$, $L^{a5}$ and $L^{a6}$ each independently represent *—O— or *—O—$(CH_2)_{d1}$—CO—O— in which * represents a binding position to —CO— and d1 represents an integer of 1 to 4, and it is more preferred that $L^{a4}$, $L^{a5}$ and $L^{a6}$ are *—O— or *—O—$CH_2$—CO—O—, and it is especially preferred that $L^{a4}$, $L^{a5}$ and $L^{a6}$ are *—O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently each represent 0 or 1.

Examples of the structural unit represented by the formula (a3-1) include the structural units represented by the formulae (a3-1-1) to (a3-1-4).

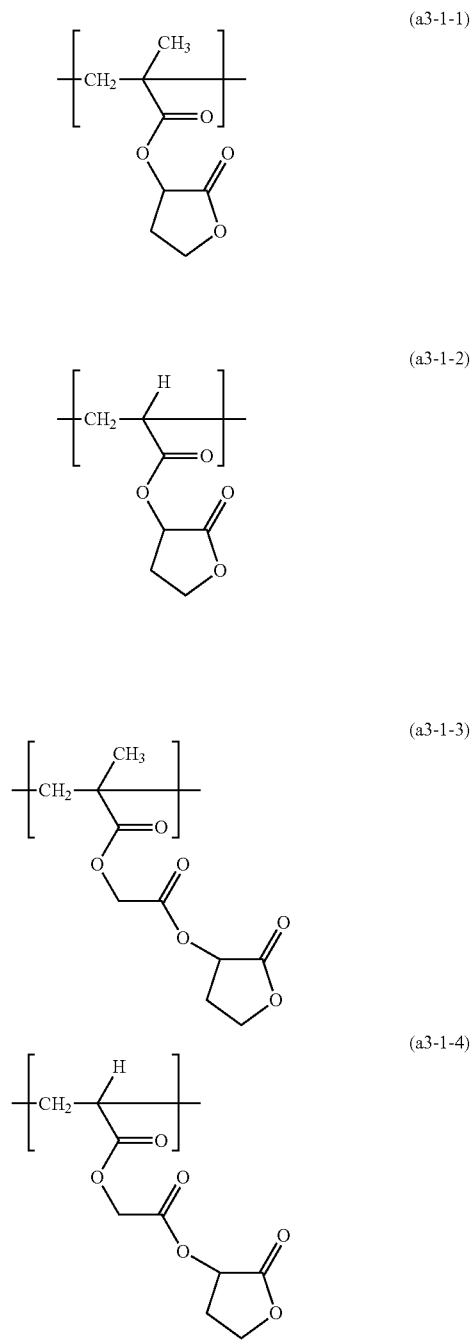

Examples of the structural unit represented by the formula (a3-2) include the structural unit represented by the formula (a3-2-1) to (a3-2-4).

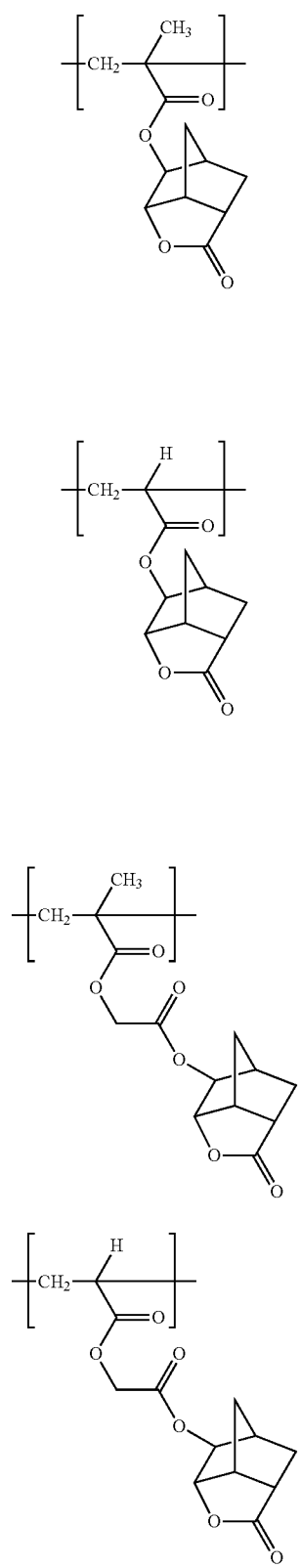

(a3-2-1)
(a3-2-2)
(a3-2-3)
(a3-2-4)

Examples of the structural unit represented by the formula (a3-3) include the structural unit represented by the formula (a3-3-1) to (a3-3-4).

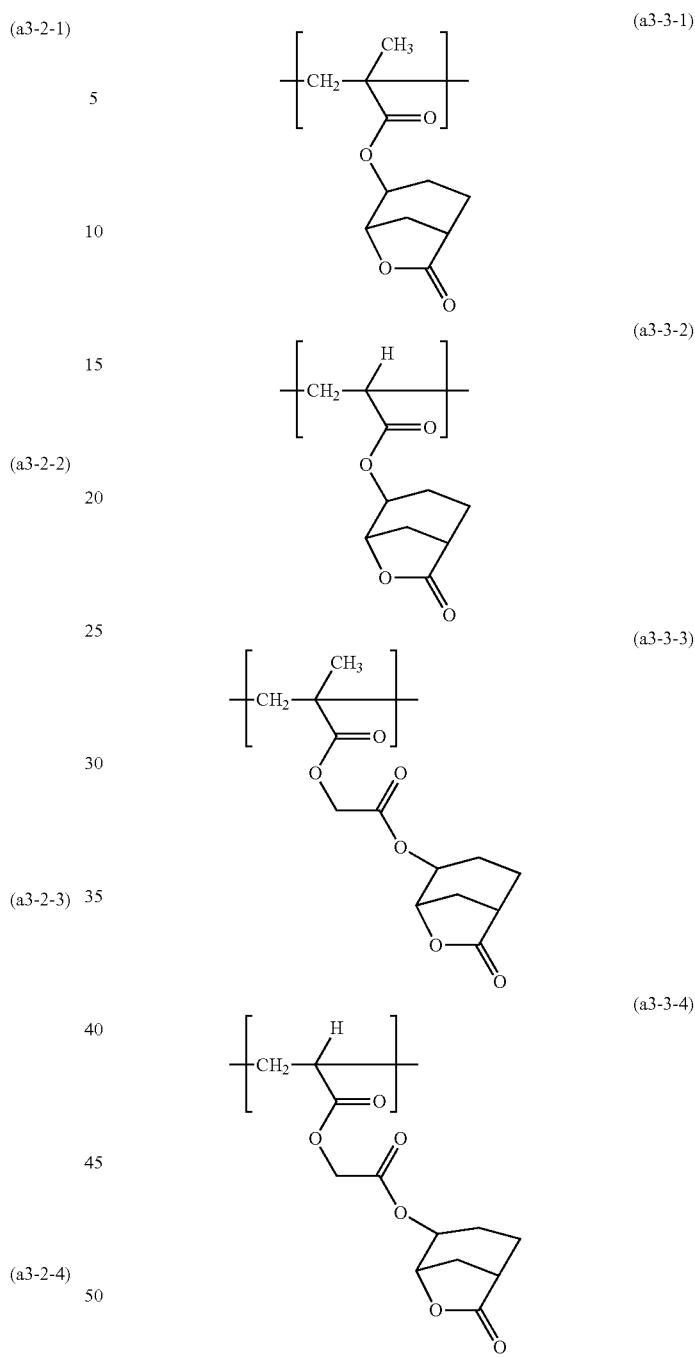

(a3-3-1)
(a3-3-2)
(a3-3-3)
(a3-3-4)

Examples of the monomers giving the structural units represented by the formulae (a3-1), (a3-2) and (a3-3) include the monomers described in JP 2010-204646 A.

When RESIN (A) contains the structural unit derived from the monomer having no acid-labile group and having a lactone ring, the content thereof is usually 5 to 70% by mole based on total molar of all the structural units of RESIN (A), and preferably 10 to 65% by mole and more preferably 10 to 60% by mole, still more preferably 15 to 55% by mole and especially preferably 15 to 50% by mole.

When RESIN (A) contains the structural unit represented by the formula (a3-1), (a3-2) or (a3-3), the content thereof is usually 5 to 60% by mole based on total molar of all the structural units of RESIN (A), respectively, and preferably 5 to 50% by mole, respectively, and more preferably 10 to 50% by mole, respectively.

Preferable resin is a resin containing the structural units derived from the monomer having an acid-labile group and the structural units derived from the monomer having no acid-labile group, and more preferable resin is a resin containing the structural units derived from the monomer having an acid-labile group and the structural units derived from the monomer having one or more hydroxyl groups and/or the monomer having a lactone ring. The monomer having an acid-labile group is preferably the monomer represented by the formula (a1-1) or the monomer represented by the formula (a1-2), and is more preferably the monomer represented by the formula (a1-1). The monomer having one or more hydroxyl groups is preferably the monomer represented by the formula (a2-1), and the monomer having a lactone ring is preferably the monomer represented by the formula (a3-1) or (a3-2).

RESIN (A) can be produced according to known polymerization methods such as radical polymerization.

RESIN (A) usually has 2,500 or more of the weight-average molecular weight, and 50,000 or less of the weight-average molecular weight. RESIN (A) preferably has 3,000 or more of the weight-average molecular weight, and 30,000 or less of the weight-average molecular weight. The weight-average molecular weight can be measured with gel permeation chromatography.

The content of RESIN (A) in the photoresist composition of the present invention is usually 80% by mass or more based on sum of solid component.

Next, component (B), that is, the acid generator will be illustrated.

The photoresist composition of the present invention can contain two or more kinds of the acid generators.

The acid generator is a substance which is decomposed to generate an acid by applying a radiation such as a light, an electron beam or the like on the substance itself or on a photoresist composition containing the substance. The acid generated from the acid generator acts on RESIN (A) resulting in cleavage of the acid-labile group existing in RESIN (A).

Examples of the acid generator include a nonionic acid generator, an ionic acid generator and the combination thereof. Examples of the nonionic acid generator include an organo-halogen compound, a sulfone compound such as a disulfone, a ketosulfone and a sulfonyldiazomethane, a sulfonate compound such as a 2-nitrobenzylsulfonate, an aromatic sulfonate, an oxime sulfonate, an N-sulfonyloxyimide, a sulfonyloxyketone and diazonaphthoquinone 4-sulfonate. Examples of the ionic acid generator include an onium salt compound such as a diazonium salt, a phosphonium salt, a sulfonium salt and an iodonium salt. Examples of the anion of the onium salt include a sulfonic acid anion, a sulfonylimide anion and a sulfonulmethide anion. The onium salt compound is preferable.

Other examples of the acid generator include acid generators described in JP 63-26653A, JP 55-164824 A, JP 62-69263A, JP 63-146038 A, JP 63-163452 A, JP 62-153853 A, JP 63-146029 A, U.S. Pat. No. 3,779,778, U.S. Pat. No. 3,849,137, DE Patent No. 3914407 and EP Patent No. 126, 712.

A fluorine-containing acid generator is preferable.

Preferable examples of the acid generator include a salt represented by the formula (B1):

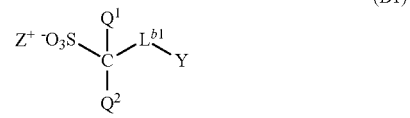

wherein $Q^1$ and $Q^2$ each independently represent a fluorine atom or a C1-C6 perfluoroalkyl group, $L^{b1}$ represents a single bond or a C1-C17 divalent aliphatic hydrocarbon group which can have one or more substituents, and one or more —$CH_2$— in the divalent aliphatic hydrocarbon group can be replaced by —O— or —CO—, Y represents a C1-C18 aliphatic hydrocarbon group which can have one or more substituents and in which one or more —$CH_2$— can be replaced by —O—, —CO— or —$SO_2$—, and $Z^+$ represents an organic cation.

Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ each independently preferably represent a fluorine atom or a trifluoromethyl group, and $Q^1$ and $Q^2$ are more preferably fluorine atoms.

Examples of the C1-C17 divalent aliphatic hydrocarbon group include a C1-C17 alkandiyl group, a monocyclic or polycyclic divalent saturated hydrocarbon group and a group formed by combining two or more groups selected from the group consisting of a C1-C17 alkandiyl group and a monocyclic or polycyclic divalent saturated hydrocarbon group.

Examples thereof include a linear alkanediyl group such as a methylene group, an ethylene group, a propane-1,3-diyl group, a butane-1,4-diyl group, a pentane-1,5-diyl, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, a branched chain alkanediyl group such as a butane-1,3-diyl group, a2-methylpropane-1,3-diyl group, a2-methylpropane-1,2-diyl group, a pentane-1,4-diyl group and a 2-methylbutane-1,4-diyl group, a monocyclic or polycyclic divalent saturated hydrocarbon group such as groups formed by removing two hydrogen atoms from the alicyclic saturated hydrocarbons represented by the above-mentioned formulae (KA-1) to (KA-22).

Examples of the C1-C17 aliphatic hydrocarbon group in which one or more —$CH_2$— are replaced by —O— or —CO— include *—CO—O-$L^{b2}$-, *—CO—O-$L^{b4}$-CO—O-$L^{b3}$-, *-$L^{b5}$-O—CO—, *-$L^{b7}$-O-$L^{b6}$-, *—CO—O-$L^{b8}$-O—, and *—CO—O-$L^{b10}$-O-$L^{b9}$-CO—O—, wherein $L^{b2}$ represents a single bond or a C1-C15 divalent aliphatic hydrocarbon group, $L^{b3}$ represents a single bond or a C1-C12 divalent aliphatic hydrocarbon group, $L^{b4}$ represents a single bond or a C1-C13 divalent aliphatic hydrocarbon group, with proviso that total carbon number of $L^{b3}$ and $L^{b4}$ is 1 to 13, $L^{b5}$ represents a C1-C15 divalent aliphatic hydrocarbon group, $L^{b6}$ represents a C1-C15 divalent aliphatic hydrocarbon group, $L^{b7}$ represents a C1-C15 divalent aliphatic hydrocarbon group, with proviso that total carbon number of $L^{b6}$ and $L^{b7}$ is 1 to 16, $L^{b8}$ represents a C1-C14 divalent aliphatic hydrocarbon group, $L^{b9}$ represents a C1-C11 divalent aliphatic hydrocarbon group, $L^{b10}$ represents a C1-C11 divalent aliphatic hydrocarbon group, with proviso that total carbon number of $L^{b9}$ and $L^{b10}$ is 1 to 12, and * represents a binding position to —C(Q$^1$)(Q$^2$)-.

The divalent aliphatic hydrocarbon group is preferably a saturated divalent aliphatic hydrocarbon group.

Among them, preferred is *—CO—O-$L^{b2}$-, and more preferred is *—CO—O-$L^{b2}$- in which $L^{b2}$ is a single bond or —CH$_2$—.

Examples of *—CO—O-$L^{b2}$- include *—CO—O— and *—CO—O—CH$_2$—. Examples of *—CO—O-$L^{b4}$-CO—O-$L^{b3}$- include *—CO—O—CH$_2$—CO—O—, *—CO—O—(CH$_2$)$_2$—CO—O—, *—CO—O—(CH$_2$)$_3$—CO—O—, *—CO—O—(CH$_2$)$_4$—CO—O—, *—CO—O—(CH$_2$)$_6$—CO—O—, *—CO—O—(CH$_2$)$_8$—CO—O—, *—CO—O—CH$_2$—CH(CH$_3$)—CO—O— and *—CO—O—CH$_2$—C(CH$_3$)$_2$—CO—O—. Examples of *-$L^{b5}$-O—CO— include *—CH$_2$—O—CO—, *—(CH$_2$)$_2$—O—CO—, *—(CH$_2$)$_3$—O—CO—, *—(CH$_2$)$_4$—O—CO—, *—(CH$_2$)$_6$—O—CO— and *—(CH$_2$)$_8$—O—CO—. Examples of *-$L^{b7}$-O-$L^{b6}$- include *—CH$_2$—O—CH$_2$—. Examples of *—CO—O-$L^{b8}$-O— include *—CO—O—CH$_2$—O—, *—CO—O—(CH$_2$)$_2$—O—, *—CO—O—(CH$_2$)$_3$—O—, *—CO—O—(CH$_2$)$_4$—O— and *—CO—O—(CH$_2$)$_6$—O—. Examples of *—CO—O-$L^{b10}$-O-$L^{b9}$-CO—O— include the followings.

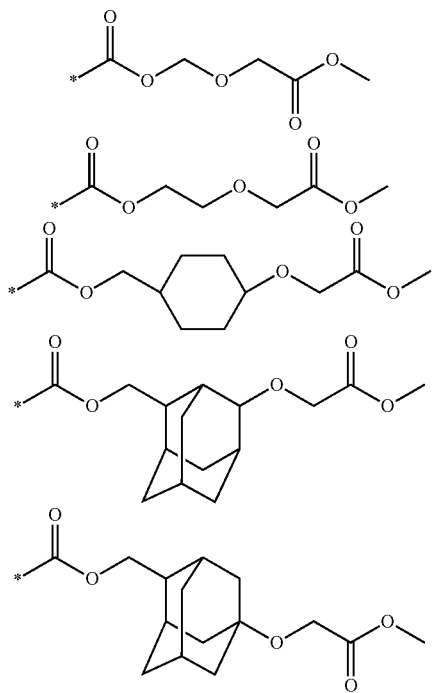

Examples of the substituent in Y include a halogen atom other than a fluorine atom, a hydroxyl group, an oxo group, a glycidyloxy group, a C2-C4 acyl group, a C1-C12 alkoxy group, a C2-C7 alkoxycarbonyl group, a C1-C12 aliphatic hydrocarbon group, a C1-C12 hydroxy-containing aliphatic hydrocarbon group, a C3-C16 saturated cyclic hydrocarbon group, a C6-C18 aromatic hydrocarbon group, a C7-C21 aralkyl group and —(CH$_2$)$_{j2}$—O—CO—R$^{b1}$— in which R$^{b1}$ represents a C1-C16 aliphatic hydrocarbon group, a C3-C16 saturated cyclic hydrocarbon group or a C6-C18 aromatic hydrocarbon group and j2 represents an integer of 0 to 4. Examples of the halogen atom include a chlorine atom, a bromine atom and an iodine atom. Examples of the acyl group include an acetyl group and a propionyl group, and examples of the alkoxy group include a methoxy group, an ethoxy group, a propoxy group, an isopropoxy group and a butoxy group.

Examples of the alkoxycarbonyl group include a methoxycarbonyl group, an ethoxycarbonyl group, a propoxycarbonyl group, an isopropoxycarbonyl group and a butoxycarbonyl group. Examples of the aliphatic hydrocarbon group include the same as described above.

Examples of the hydroxyl-containing aliphatic hydrocarbon group include a hydroxymethyl group. Examples of the C3-C16 saturated cyclic hydrocarbon group include the same as described above, and examples of the aromatic hydrocarbon group include a phenyl group, a naphthyl group, an anthryl group, a p-methylphenyl group, a p-tert-butylphenyl group and a p-adamantylphenyl group. Examples of the aralkyl group include a benzyl group, a phenethyl group, a phenylpropyl group, a trityl group, a naphthylmethyl group and a naphthylethyl group.

The C1-C18 aliphatic hydrocarbon group represented by Y includes a chain aliphatic hydrocarbon group and an alicyclic hydrocarbon group. Y is preferably an alkyl group or an alicyclic hydrocarbon group, and more preferably a C1-C6 alkyl group or a C3-C12 alicyclic hydrocarbon group, and especially preferably a C3-C12 alicyclic hydrocarbon group.

Examples of the C1-C18 aliphatic hydrocarbon group represented by Y include a methyl group, an ethyl group, a propyl group, an isopropyl group, a butyl group, an isobutyl group, a sec-butyl group, a tert-butyl group, a pentyl group, a neopentyl group, a 1-methylbutyl group, a 2-methylbutyl group, a 1,2-dimethylpropyl group, a 1-ethylpropyl group, a hexyl group, a 1-methylpentyl group, a heptyl group, an octyl group, a 2-ethylhexyl group, a nonyl group, a decyl group, an undecyl group and a dodecyl group.

Examples of the aliphatic hydrocarbon group in which one or more —CH$_2$— are replaced by —O—, —CO— or —SO$_2$— include a group having an ether structure or a cyclic ether structure, a saturated cyclic hydrocarbon group having an oxo group, a sultone ring group and a lactone ring group.

Examples of the C3-C18 alicyclic hydrocarbon group represented by Y include the groups represented by the formulae (Y1) to (Y29):

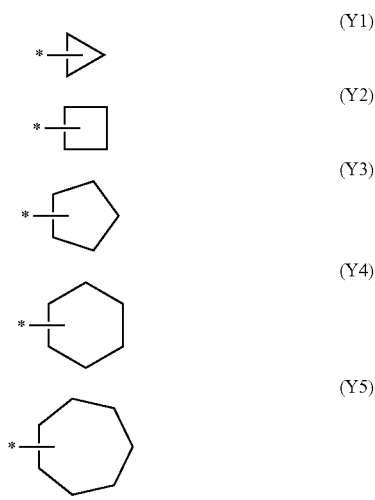

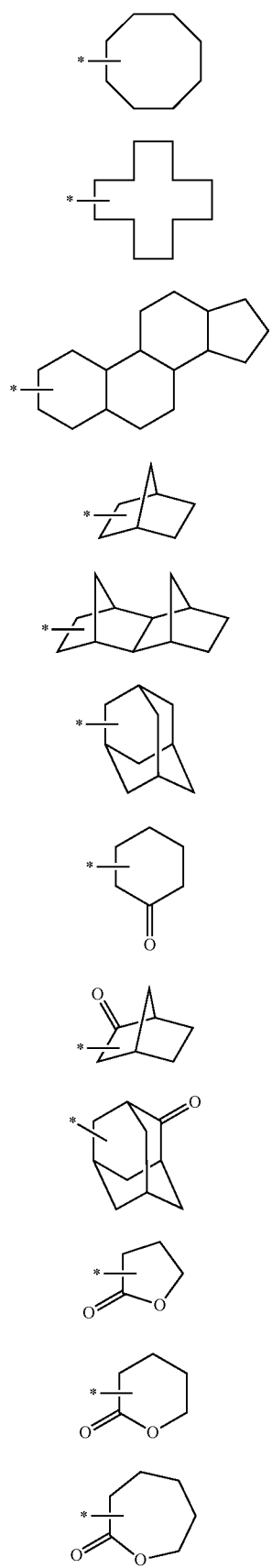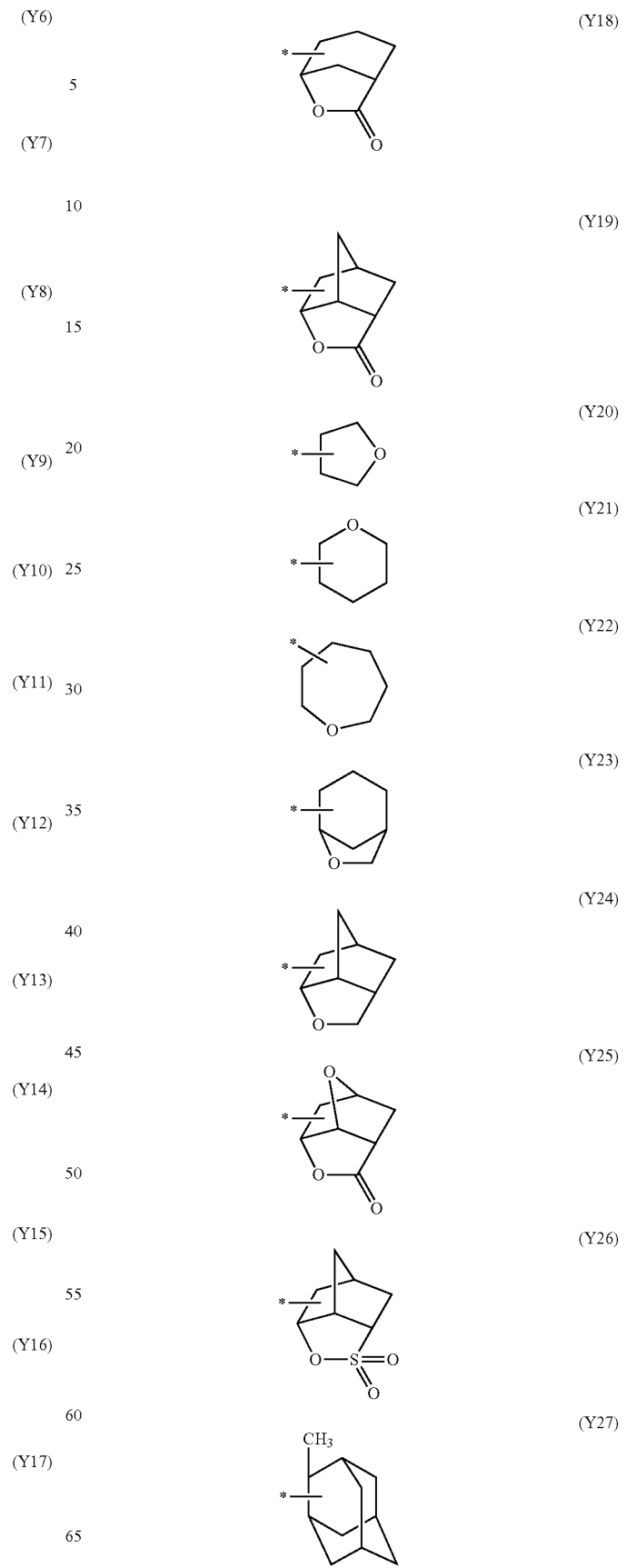

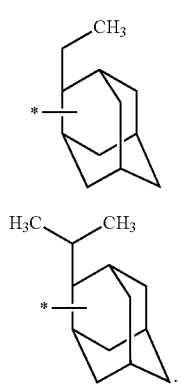

(Y28)

(Y29)

Among them, preferred are the groups represented by the formulae (Y1) to (Y19) and (Y27) to (Y29), and more preferred are the groups represented by the formulae (Y11), (Y14), (Y15), (Y19), (Y27), (Y28) and (Y29), and still more preferred are the groups represented by the formulae (Y11) and (Y14).

Examples of Y having one or more substituents include the followings:

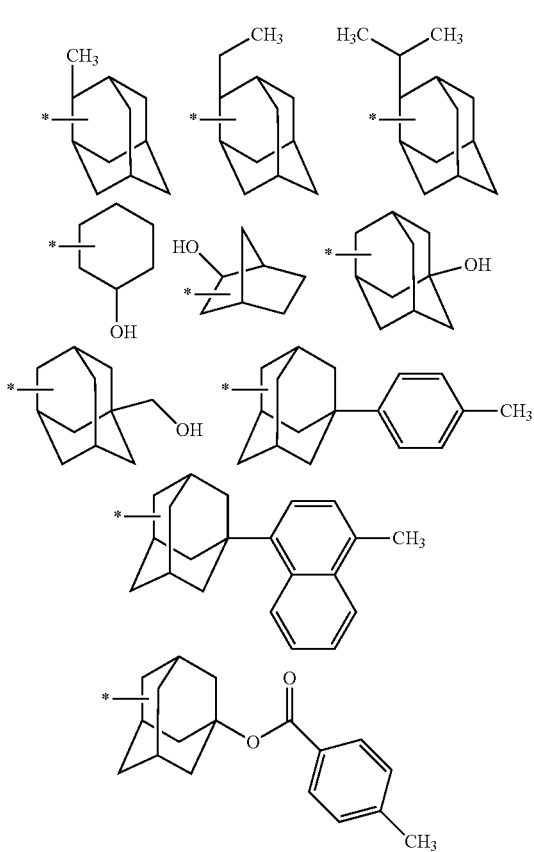

Y is preferably a C3-C18 alicyclic hydrocarbon group which can have one or more substituents, and more preferably an adamantyl group which can have one or more substituents, and still more preferably an adamantyl group, a hydroxyadamantyl group or an oxoadamantyl group.

Among the sulfonic acid anions of the acid generator represented by the formula (B1), preferred is a sulfonic acid anion having *—CO—O—$L^{b2}$-, and more preferred are anions represented by the formulae (b1-1-1) to (b1-1-9).

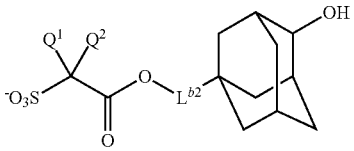

(b1-1-1)

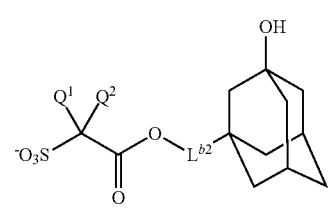

(b1-1-2)

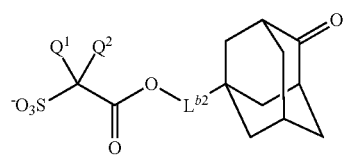

(b1-1-3)

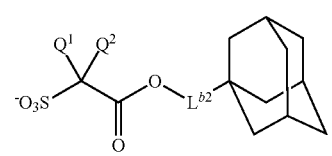

(b1-1-4)

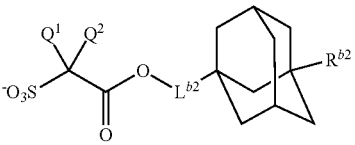

(b1-1-5)

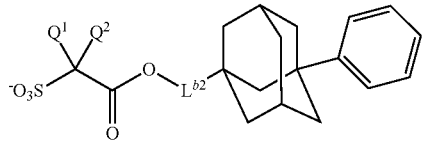

(b1-1-6)

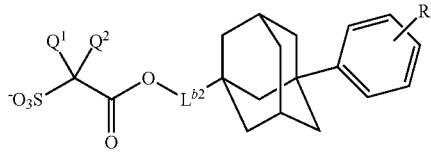

(b1-1-7)

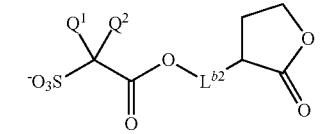

(b1-1-8)

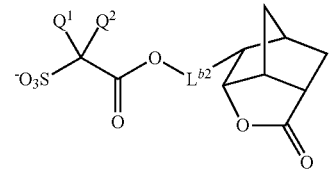

(b1-1-9)

wherein $Q^1$, $Q^2$ and $L^{b2}$ are the same as defined above, and $R^{b2}$ and $R^{b3}$ each independently represent a C1-C4 aliphatic hydrocarbon group and it is more preferred that $R^{b2}$ and $R^{b3}$ each independently represent a methyl group.
Examples of the anions represented by the formulae (b1-1-1) to (b1-1-9) include anions described in JP 2010-204646 A.
Specific examples of the sulfonic acid anion include the followings.
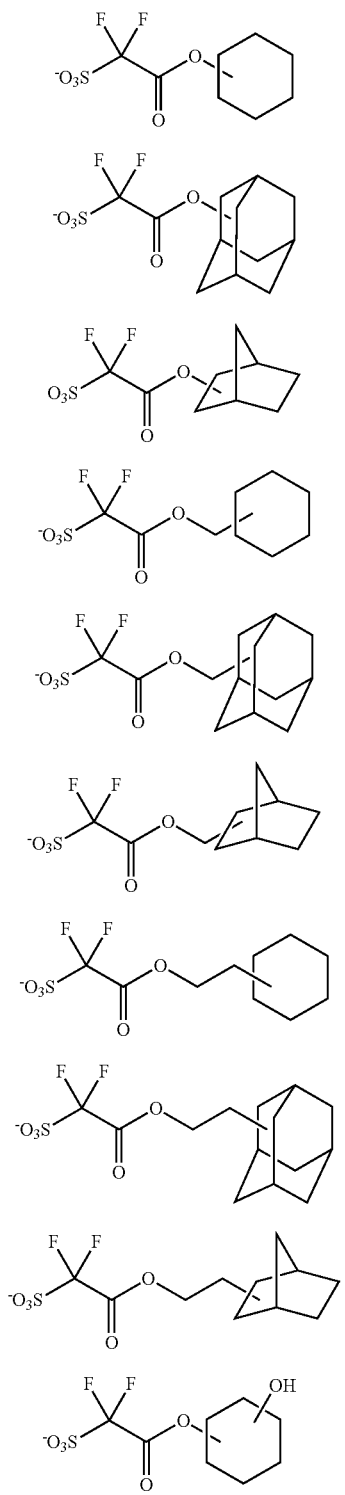
-continued
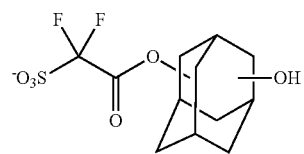 (b1-s-11)
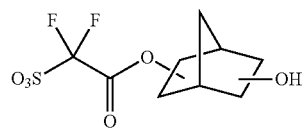 (b1-s-12)
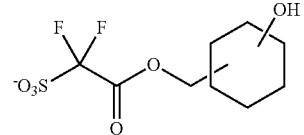 (b1-s-13)
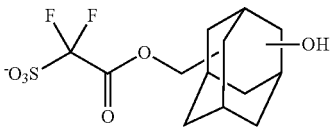 (b1-s-14)
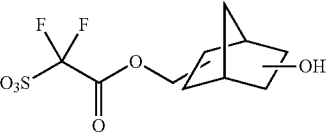 (b1-s-15)
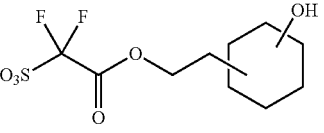 (b1-s-16)
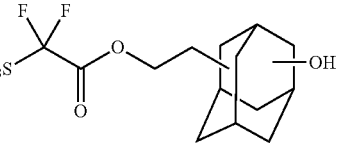 (b1-s-17)
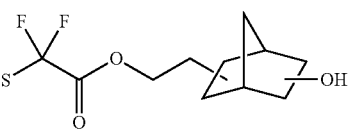 (b1-s-18)
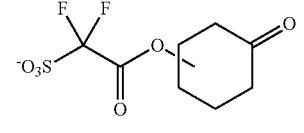 (b1-s-19)
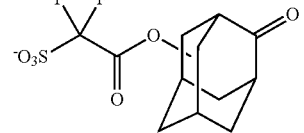 (b1-s-20)
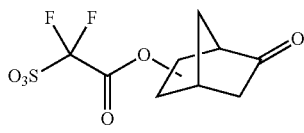 (b1-s-21)

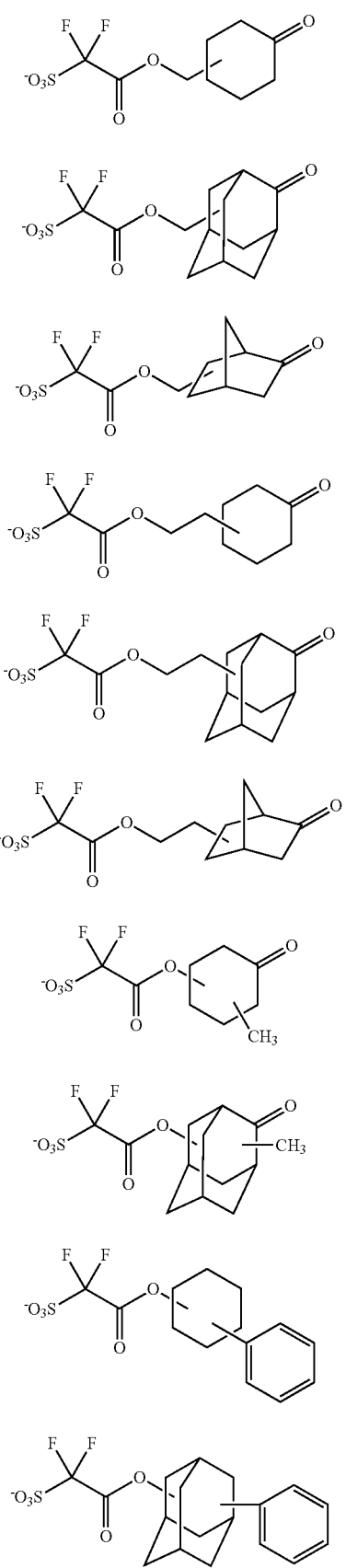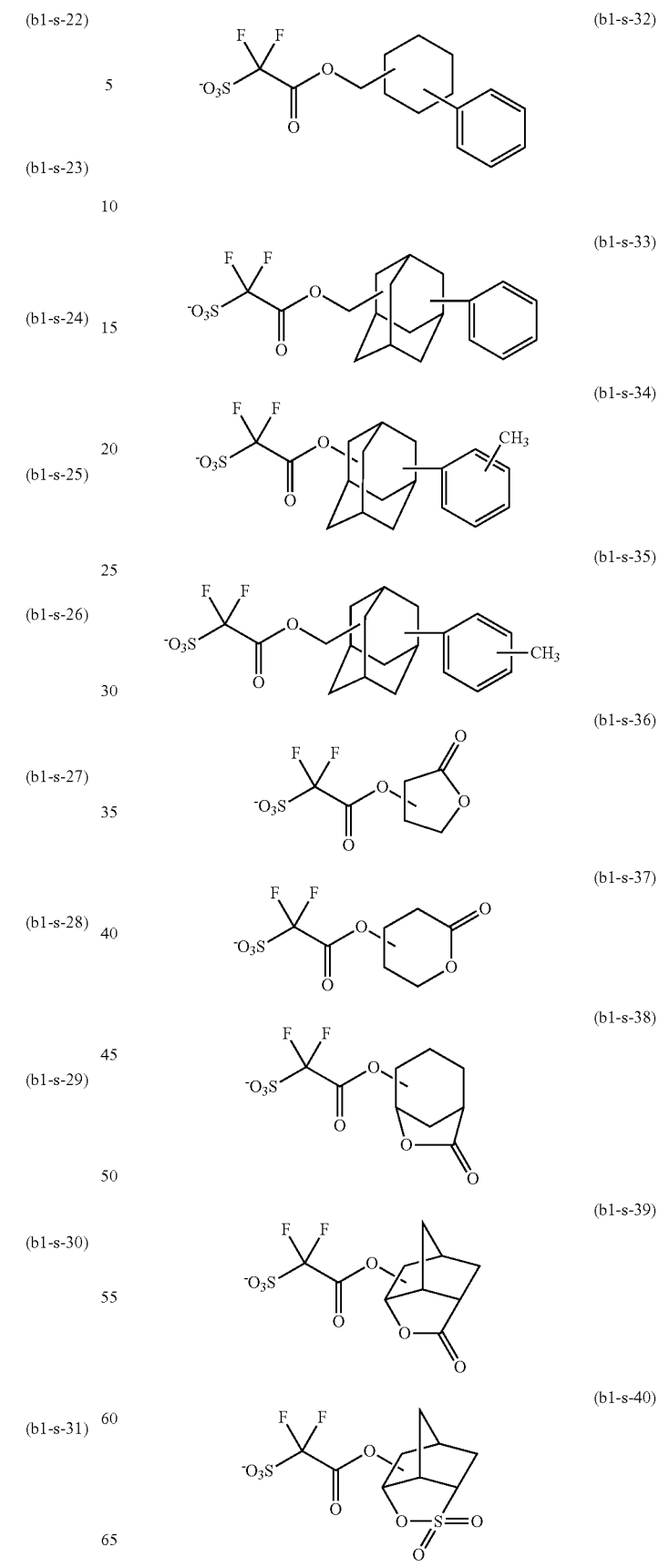

(bs-1-41)

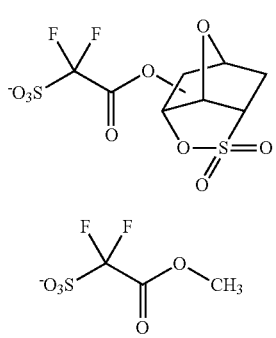

(bs-s-42)

Examples of the organic counter ion represented by $Z^+$ include an onium cation such as an organic sulfonium cation, an organic iodonium cation, an organic ammonium cation, a benzothiazolium cation and an organic phosphonium cation, and an organic sulfonium cation and an organic iodonium cation are preferable, and an organic sulfonium cation is more preferable.

Preferable examples of the organic counter ion represented by $Z^+$ include the organic cations represented by the formulae (b2-1) to (b2-4):

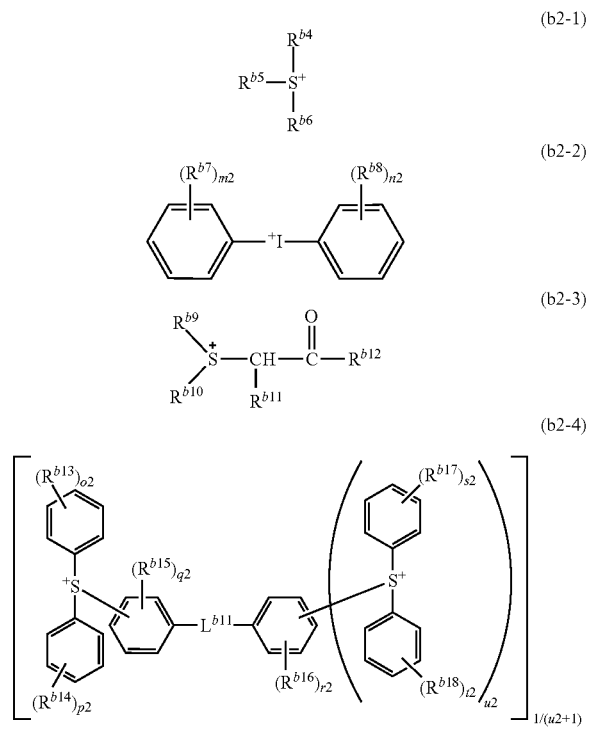

In the formulae (b2-1) to (b2-4), $R^{b4}$, $R^{b5}$ and $R^{b6}$ independently represent a C1-C30 hydrocarbon group. As the C1-C30 hydrocarbon group, a C1-C30 alkyl group, a C3-C18 alicyclic hydrocarbon group and a C6-C18 aromatic hydrocarbon group are preferable. The alkyl group can have one or more substituents selected from the group consisting of a hydroxyl group, a C1-C12 alkoxy group and a C6-C18 aromatic hydrocarbon group. The C3-C18 alicyclic hydrocarbon group can have one or more substituents selected from the group consisting of a halogen atom, a C2-C4 acyl group and a glycidyloxy group. The C6-C18 aromatic hydrocarbon group can have one or more substituents selected from the group consisting of a halogen atom, a hydroxyl group, a C1-C18 aliphatic hydrocarbon group, a C3-C18 saturated cyclic hydrocarbon group and a C1-C12 alkoxy group.

$R^{b7}$ and $R^{b8}$ are independently in each occurrence a hydroxyl group, a C1-C12 alkyl group or a C1-C12 alkoxy group, m2 and n2 independently represents an integer of 0 to 5.

$R^{b9}$ and $R^{b10}$ independently represent a C1-C18 alkyl group or a C3-C18 alicyclic hydrocarbon group.

$R^{b11}$ represents a hydrogen atom, a C1-C18 alkyl group, a C3-C18 alicyclic hydrocarbon group or a C6-C18 aromatic hydrocarbon group.

When $R^{b9}$, $R^{b10}$ and $R^{b11}$ each independently represent an alkyl group, it is preferably a C1-C12 alkyl group, and when $R^{b9}$, $R^{b10}$ and $R^{b11}$ each independently represent an alicyclic hydrocarbon group, it is preferably C3-C18 alicyclic hydrocarbon group and more preferably C4-C12 alicyclic hydrocarbon group.

$R^{b12}$ represents a C1-C18 hydrocarbon group and examples thereof include a C1-C18 aliphatic hydrocarbon group, a C3-C18 saturated cyclic hydrocarbon group and a C6-C18 aromatic hydrocarbon group and the aromatic hydrocarbon group can have one or more substituents selected from the group consisting of a C1-C12 aliphatic hydrocarbon group, a C1-C12 alkoxy group, a C3-C18 saturated cyclic hydrocarbon group and a (C1-C12 alkyl) carbonyloxy group.

$R^{b9}$ and $R^{b10}$ can be bonded to form a C2-C11 divalent acyclic hydrocarbon group which forms a ring together with the adjacent $S^+$, and one or more —$CH_2$— in the divalent acyclic hydrocarbon group may be replaced by —CO—, —O— or —S—, and preferred is a C2-C6 divalent acyclic hydrocarbon group.

$R^{b11}$ and $R^{b12}$ can be bonded each other to form a C1-C10 divalent acyclic hydrocarbon group which forms a 2-oxocycloalkyl group together with the adjacent —CHCO—, and one or more —$CH_2$— in the divalent acyclic hydrocarbon group may be replaced by —CO—, —O— or —S—, and preferred is a C1-C5 divalent acyclic hydrocarbon group.

$R^{b13}$, $R^{b14}$, $R^{b15}$, $R^{b16}$, $R^{b17}$ and $R^{b18}$ independently represent a hydroxyl group, a C1-C12 alkyl group or a C1-C12 alkoxy group.

$L^{b11}$ represents —S— or —O— and o2, p2, s2 and t2 each independently represents an integer of 0 to 5, q2 and r2 each independently represents an integer of 0 to 4, and u2 represents 0 or 1.

Preferable examples of the aliphatic hydrocarbon group represented by $R^{b4}$ to $R^{b6}$ include an alkyl group such as a methyl group, an ethyl group, a propyl group, an isopropyl group, 2,2-dmethylethyl group, 1-methylpropyl group, a 2-methylpropyl group, a 1,2-dimethylpropyl group, a 2,2-dimethylpropyl group, a 1-ethylpropyl group, a butyl group, a sec-butyl group, a tert-butyl group, a pentyl group, a 1-methylbutyl group, a 2-methylbutyl group, a 3-methylbutyl group, a hexyl group, a 1-propylbutyl group, a 1-methylpentyl group, a 2-ethylhexyl group, a 1,4-dimethylhexyl group, a 1-methylheptyl group, an octyl group, a decyl group, a dodecyl group, a hexadecyl group, a pentadecyl group, a heptadecyl group and an octadecyl group, and more preferable examples thereof include a methyl group, an ethyl group, a propyl group, an isopropyl group, a butyl group, a sec-butyl group, a tert-butyl group, a pentyl group, a hexyl group, an octyl group and a 2-ethylhexyl group.

The saturated cyclic hydrocarbon group may be monocyclic or polycyclic. Preferable examples thereof include a cycloalkyl group such as a cyclopentyl group, a cyclohexyl group, a methylcyclohexyl group, a dimethylcyclohexyl group, a cycloheptyl group and a cyclooctyl group, a group obtained by hydrogenating a condensed aromatic hydrocarbon group such as a hydronaphthyl group, a bridged cyclic hydrocarbon group such as an adamantyl group, a norbornyl group and a methylnorbornyl group, and the following groups.

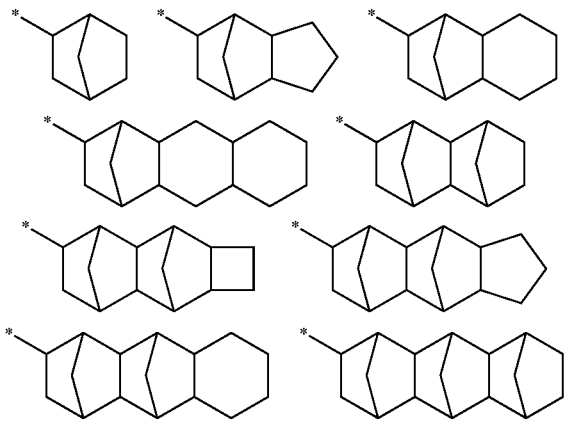

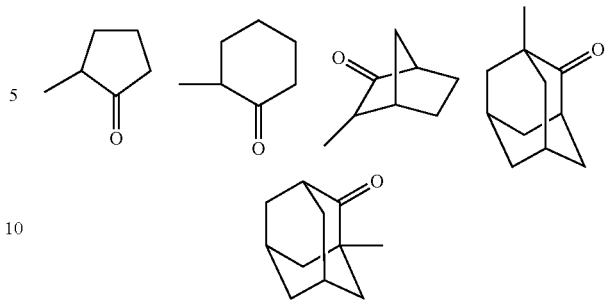

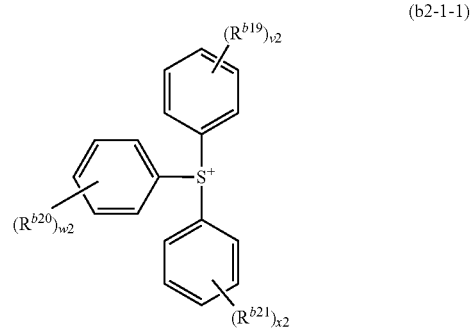

Among them, preferred are a cyclopropyl group, a cyclobutyl group, a cyclopentyl group, a cyclohexyl group, a cyclodecyl group, a 2-alkyl-2-adamantyl group, a 1-(1-adamantyl)alkan-1-yl group and an isobornyl group.

Preferable examples of the aromatic group include an aryl group such as a phenyl group, a naphthyl group, an anthryl group, a 4-methylphenyl group, a 4-ethylphenyl group, a 4-tert-butylphenyl group, a 4-cyclohexylphenyl group, a 4-methoxyphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group, and a phenyl group, a 4-methylphenyl group, a 4-ethylphenyl group, a 4-tert-butylphenyl group, a 4-cyclohexylphenyl group, a 4-methoxyphenyl group, a biphenyl group and a naphthyl group are more preferable.

Examples of the C1-C12 alkoxy group include a methoxy group, an ethoxy group, a propoxy group, a butoxy group, a pentyloxy group, a hexyloxy group, a heptyloxy group, an octyloxy group, a decyloxy group and a dodecyloxy group. Examples of the halogen atom include a fluorine atom, a chlorine atom, a bromine atom and an iodine atom. Examples of the C2-C4 acyl group include an acetyl group, a propyonyl group and a butyryl group.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferable.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group and examples of the ring group include the followings.

A C1-C5 divalent acyclic hydrocarbon group is preferable.

Examples of the C2-C13 acyloxy group include an acetyloxy group, a propyonyloxy group, a butyryloxy group, an isopropylcarbonyloxy group, a butylcarbonyloxy group, a sec-butylcarbonyloxy group, a tert-butylcarbonyloxy group, a pentylcarbonyloxy group, a hexylcarbonyloxy group, an octylcarbonyloxy group and a 2-ethylhexylcarbonyloxy group.

Examples of the cations represented by the formulae (b2-1) to (b2-4) include those described in JP 2010-204646 A.

Among the above-mentioned cations, preferred is the cation represented by the formula (b2-1), and more preferred is the cation represented by the formula (b2-1-1). A triphenylsulfonium cation and a trytolysulfonium cation are especially preferable.

(b2-1-1)

wherein $R^{b19}$, $R^{b20}$ and $R^{b21}$ are independently in each occurrence a halogen atom (preferably a fluorine atom), a hydroxyl group, a C1-C18 aliphatic hydrocarbon group or a C1-C12 alkoxy group, and one or more hydrogen atoms of the aliphatic hydrocarbon group can be replaced by a hydroxyl group, a C1-C12 alkoxy group or a C6-C18 aromatic hydrocarbon group, and one or more hydrogen atoms of the saturated cyclic hydrocarbon group can be replaced by a halogen atom, a glycidyloxy group or a C2-C4 acyl group, and v2, w2 and x2 independently each represent an integer of 0 to 5.

The aliphatic hydrocarbon group has preferably 1 to 12 carbon atoms, and a C1-C12 alkyl group and a C4-C18 alicyclic hydrocarbon group are preferable, and v2, w2 and x2 independently each preferably represent 0 or 1.

It is preferred that $R^{b19}$, $R^{b20}$ and $R^{b21}$ are independently in each occurrence a halogen atom, a hydroxyl group, a C1-C12 alkyl group or a C1-C12 alkoxy group, and v2, w2 and x2 independently each represent an integer of 0 to 5. It is more preferred that $R^{b19}$, $R^{b20}$ and $R^{b21}$ are independently in each occurrence a fluorine atom, a hydroxyl group, a C1-C12 alkyl group or a C1-C12 alkoxy group, and v2, w2 and x2 independently each represent 0 or 1.

Examples of the cations represented by the formulae (b2-1) to (b2-4) include the cations described in JP 2010-204646 A.

Examples of the salt represented by the formula (B1) include a salt wherein the anion part is any one of the above-mentioned anion and the cation part is anyone of the above-mentioned cation.

Preferable examples of the salt include a combination of any one of anions represented by the formulae (b1-1-1) to (b1-1-9) and the cation represented by the formulae (b2-1-1), and a combination of anyone of anions represented by the formulae (b1-1-3) to (b1-1-5) and the cation represented by the formulae (b2-3).

The salt represented by the formulae (B1-1) to (B1-17) are preferable, and the salt represented by the formulae (B1-2), (B1-3), (B1-6), (B1-7), (B1-11), (B1-12), (B1-13) and (B1-14) which contain a triphenylsulfonium cation or a tritolyl-sulfonium cation are more preferable. The salts represented by the formulae (B1-2), (B1-3), (B1-6), (B1-7) and (B1-11) are more preferable.

(B1-1)

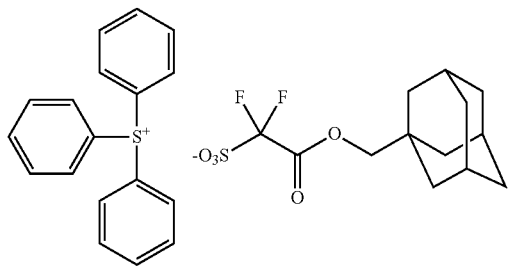

(B1-2)

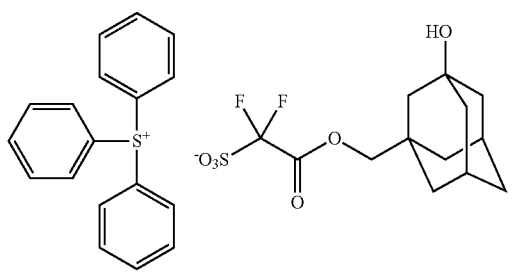

(B1-3)

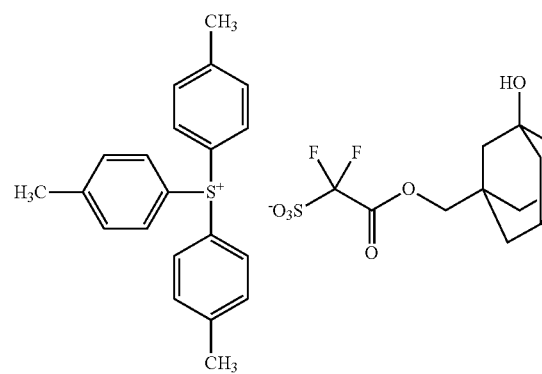

(B1-4)

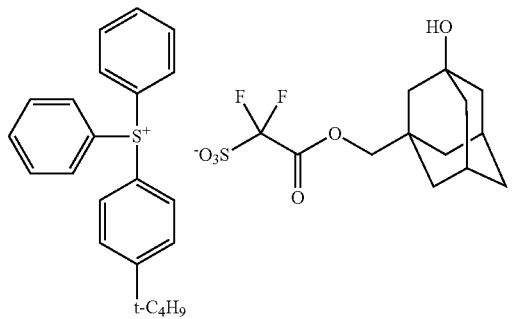

(B1-5)

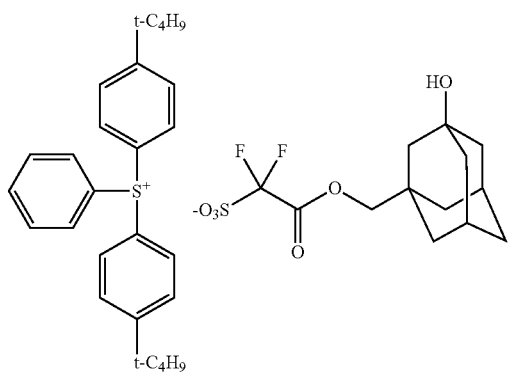

(B1-6)

(B1-7)

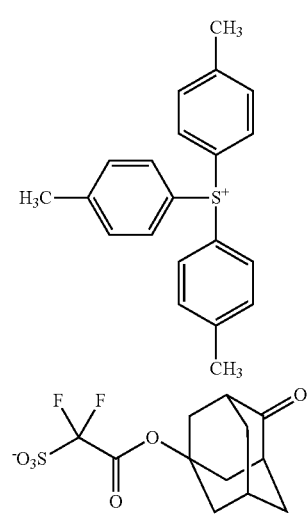

(B1-8)
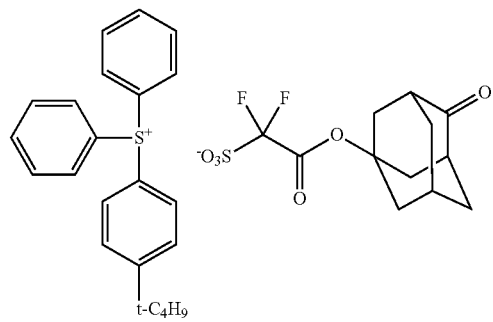
(B1-9)
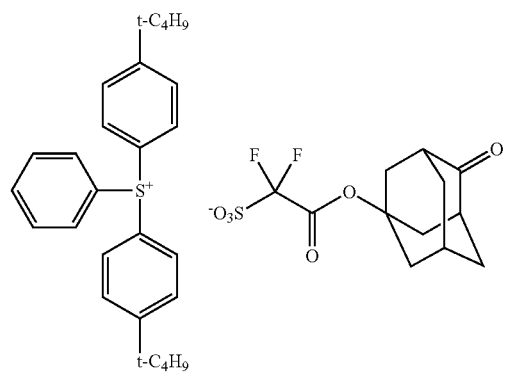
(B-10)
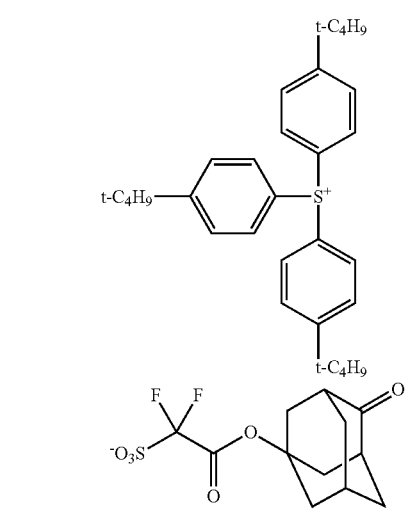
(B1-11)
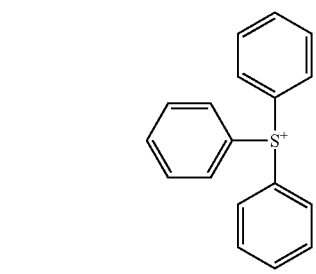
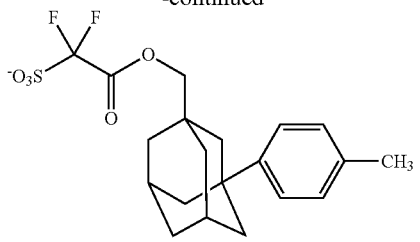
(B1-12)
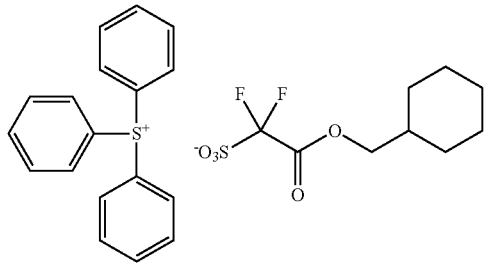
(B1-13)
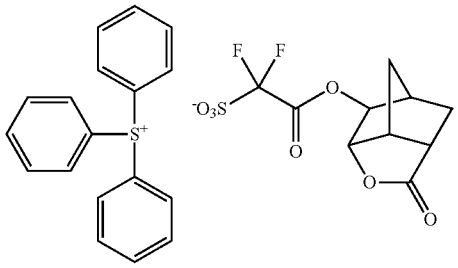
(B1-14)
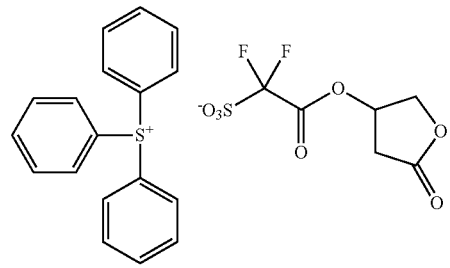
(B1-15)
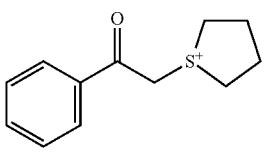
(B1-16)
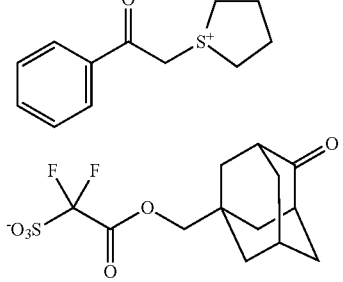

(B1-17)

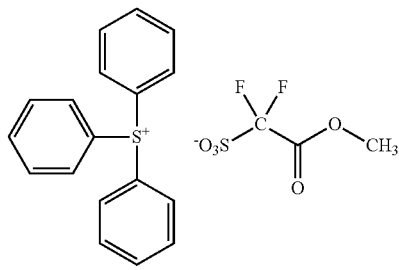

Two or more kinds of the acid generator can be used in combination.

The content of component (B) is usually 1 part by mass or more and 30 parts by mass or less per 100 parts by mass of component (A), and preferably 3 parts by mass or more and 25 parts by mass or less.

The photoresist compositions of the present invention can contain a basic compound, as a quencher, other than component (X).

The basic compound has the property that it can trap an acid, especially an acid generated from the acid generator by applying a radiation.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (C2):

(C2)

$$Ar^{c1}-N\begin{matrix}R^{c5}\\R^{c6}\end{matrix}$$

wherein $Ar^{c1}$ represents an aromatic hydrocarbon group, and $R^{c5}$ and $R^{c6}$ independently represent a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group.

The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms.

As the aromatic amine represented by the formula (C2), an amine represented by the formula (C2-1):

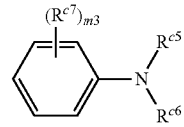

(C2-1)

wherein $R^{c5}$ and $R^{c6}$ are the same as defined above, and $R^{c7}$ is independently in each occurrence an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and m3 represents an integer of 0 to 3, is preferable. The aliphatic hydrocarbon group is preferably an alkyl group and the saturated cyclic hydrocarbon group is preferably a cycloalkyl group. The aliphatic hydrocarbon group preferably has 1 to 6 carbon atoms.

The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

Examples of the aromatic amine represented by the formula (C2) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline.

Other examples of the basic compound include amines represented by the formulae (C3) to (C11):

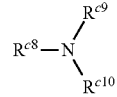

(C3)

(C4)

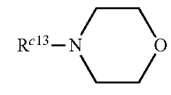

(C5)

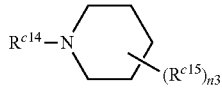

(C6)

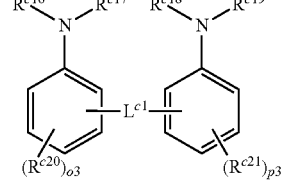

(C7)

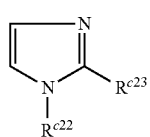

(C8)

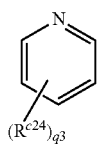

(C9)

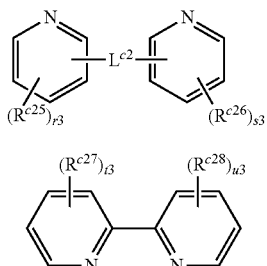

(C10)

(C11)

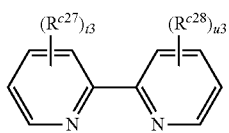

wherein $R^{c8}$, $R^{c20}$, $R^{c21}$, and $R^{c23}$ to $R^{c28}$ independently represent an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c9}$, $R^{c10}$, $R^{c11}$ to $R^{c14}$, $R^{c16}$ to $R^{c19}$, and $R^{c22}$ independently represents a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c15}$ is independently in each occurrence an aliphatic hydrocarbon group, a saturated cyclic hydrocarbon group or an alkanoyl group, $L^{c1}$ and $L^{c2}$ independently represents a divalent aliphatic hydrocarbon group, —CO—, —C(=NH)—, —C(=NR$^{c3}$)—, —S—, —S—S— or a combination thereof and $R^{c3}$ represents a C1-C4 alkyl group, O3 to u3 each independently represents an integer of 0 to 3 and n3 represents an integer of 0 to 8.

The aliphatic hydrocarbon group has preferably 1 to 6 carbon atoms, and the saturated cyclic hydrocarbon group has preferably 3 to 6 carbon atoms, and the alkanoyl group has preferably 2 to 6 carbon atoms, and the divalent aliphatic hydrocarbon group has preferably 1 to 6 carbon atoms. The divalent aliphatic hydrocarbon group is preferably an alkylene group.

Examples of the amine represented by the formula (C3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (C4) include piperazine. Examples of the amine represented by the formula (C5) include morpholine. Examples of the amine represented by the formula (C6) include piperidine and hindered amine compounds having a piperidine skeleton as disclosed in JP 11-52575 A. Examples of the amine represented by the formula (C7) include 2,2'-methylenebisaniline. Examples of the amine represented by the formula (C8) include imidazole and 4-methylimidazole. Examples of the amine represented by the formula (C9) include pyridine and 4-methylpyridine. Examples of the amine represented by the formula (C10) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine and 2,2'-dipicolylamine. Examples of the amine represented by the formula (C11) include bipyridine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

When the photoresist composition contains the basic compound other than component (X), the content thereof is usually 200 parts by mass or less per 100 parts by mass of component (X), preferably 150 parts by mass or less, and more preferably 100 parts by mass or less, and especially preferably 80 parts by mass or less. When the photoresist composition contains the basic compound other than component (X), the content thereof is usually 1 part by mass or more per 100 parts by mass of component (X), and preferably 5 parts by mass or more.

The photoresist compositions of the present invention usually contain one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by mass or more, preferably 92% by mass or more preferably 94% by mass or more based on total amount of the photoresist composition of the present invention. The amount of the solvent is usually 99.9% by mass or less and preferably 99% by mass or less based on total amount of the photoresist composition of the present invention.

The photoresist compositions of the present invention can contain, if necessary, a small amount of various additives such as a sensitizer, a dissolution inhibitor, other polymers, a surfactant, a stabilizer and a dye as long as the effect of the present invention is not prevented.

The photoresist compositions of the present invention are useful for a chemically amplified photoresist composition.

A photoresist pattern can be produced by the following steps (1) to (5):

(1) a step of applying the first or second photoresist composition of the present invention on a substrate,
(2) a step of forming a photoresist film by conducting drying,
(3) a step of exposing the photoresist film to radiation,
(4) a step of baking the exposed photoresist film, and
(5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having a pore size of 0.01 to 0.2 µm before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a $F_2$ laser (wavelength: 157 nm), and a light source radiating harmonic laser light in a far UV region or a vacuum UV region by wavelength conversion of laser light from a solid laser light source (such as YAG or semiconductor laser).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammonium hydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern showing good Exposure Latitude (EL), and therefore, the photoresist composition of the present invention is suitable for ArF excimer laser lithography, KrF excimer laser lithography, ArF immersion lithography, EUV (extreme ultraviolet) lithography, EUV immersion lithography and EB (electron beam) lithography. Further, the photoresist composition of the present invention can especially be used for EUV lithography and EB lithography.

EXAMPLES

The present invention will be described more specifically by Examples, which are not construed to limit the scope of the present invention.

The "%" and "part(s)" used to represent the content of any component and the amount of any material used in the following examples and comparative examples are on a mass basis unless otherwise specifically noted. The weight-average molecular weight of any material used in the following examples is a value found by gel permeation chromatography [Apparatus: HLC-8120 GPC Type, manufactured by TOSOH CORPORATION, Column: Three of TSKgel Multipore HXL-M with guard column, manufactured by TOSOH CORPORATION, Solvent: tetrahydrofuran, Flow rate: 1.0 mL/min., Detector: RI Detector, Column temperature: 40° C., Injection volume: 100 µL] using standard polystyrene manufactured by TOSOH CORPORATION as a standard reference material.

Monomers used in the following Resin Synthesis Examples are following monomers represented by the formulae (a1-1-2m), (a1-1-3m), (a1-2-3m), (a1-5-1), (a2-1-1m), (a3-1-1m) and (a3-2-3m). The monomer represented by the formula (a1-1-2m) is called as Monomer (a1-1-2m). The monomer represented by the formula (a1-1-3m) is called as Monomer (a1-1-3m). The monomer represented by the formula (a1-2-3m) is called as Monomer (a1-2-3m). The monomer represented by the formula (a1-5-1) is called as Monomer (a1-5-1). The monomer represented by the formula (a2-1-1m) is called as Monomer (a2-1-1m).

The monomer represented by the formula (a3-1-1m) is called as Monomer (a3-1-1m). The monomer represented by the formula (a3-2-3m) is called as Monomer (a3-2-3m).

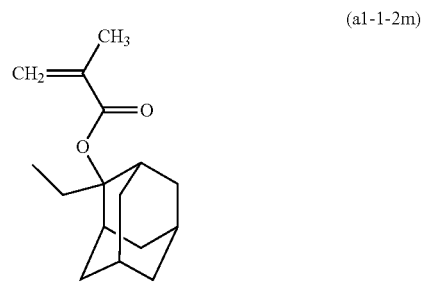

(a1-1-2m)

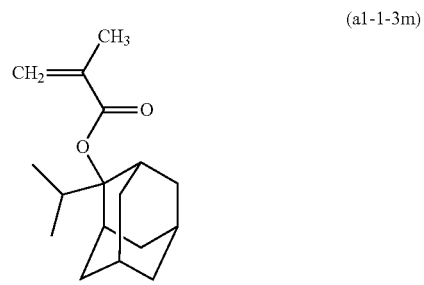

(a1-1-3m)

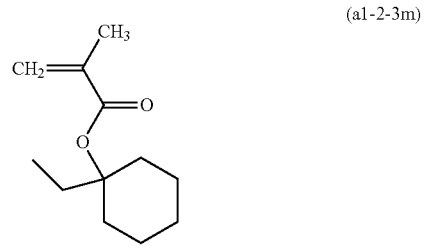

(a1-2-3m)

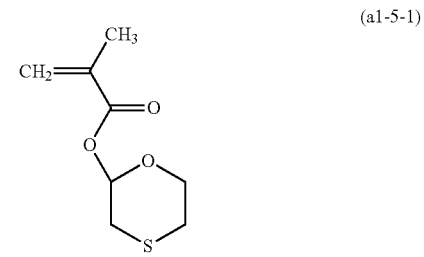

(a1-5-1)

(a2-1-1m)

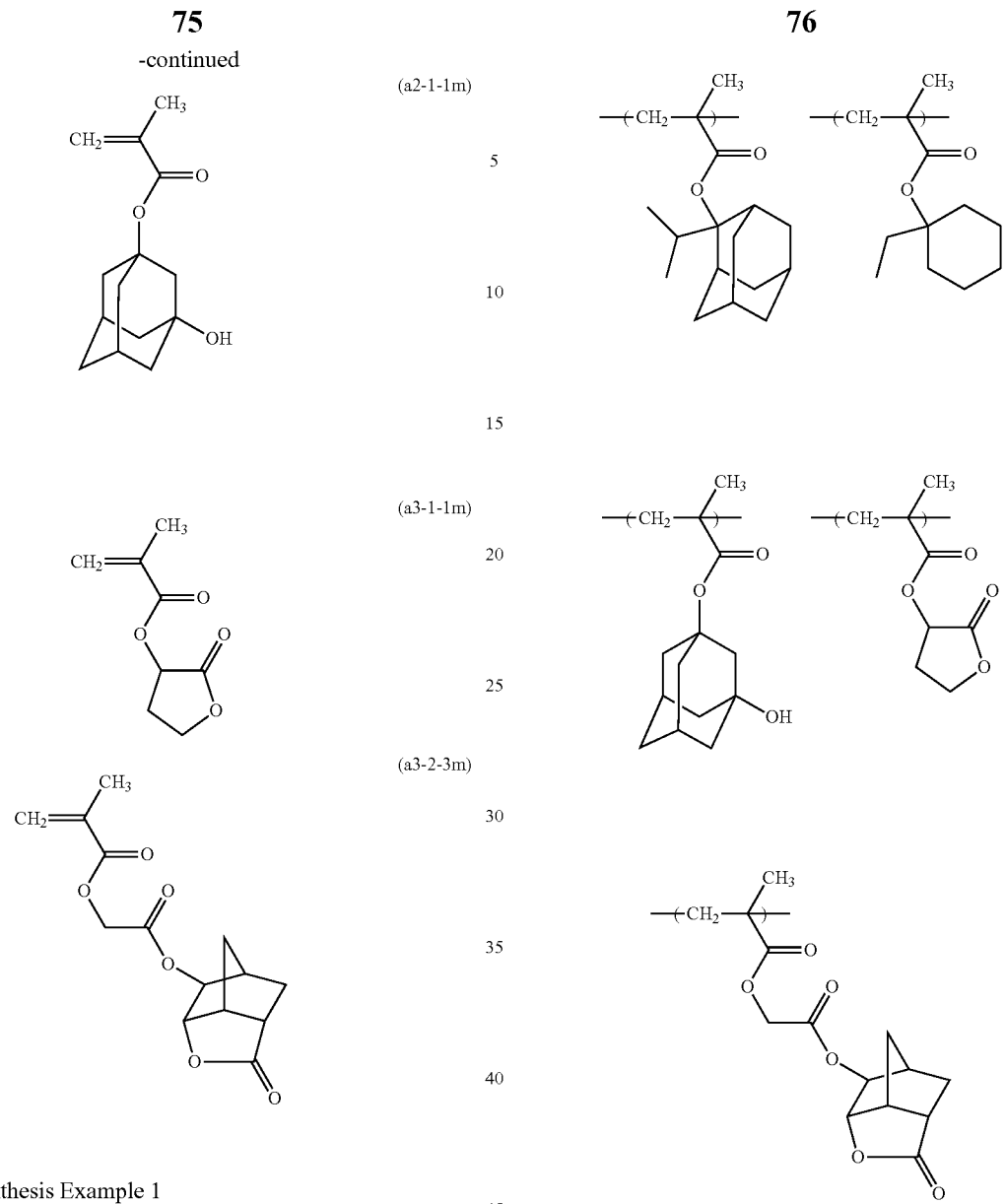

Resin Synthesis Example 1

The monomers (a1-1-3m), (a1-2-3m), (a2-1-1m), (a3-1-1m) and (a3-2-3m) were mixed in a molar ratio of 30/14/6/20/30 (monomer (a1-1-3m)/monomer (a1-2-3m)/monomer (a2-1-1m)/monomer (a3-1-1m)/monomer (a3-2-3m)), and 1,4-dioxane in 1.5 times part based on total parts of all monomers was added to prepare a solution.

To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 73° C. for about 5 hours. The reaction mixture obtained was poured into a large amount of a mixture of methanol and water to cause precipitation. The precipitate was collected by filtration and then, was dissolved in 1,4-dioxane followed by poured the resultant solution into a large amount of a mixture of methanol and water to cause precipitation. This operation was repeated twice for purification. As a result, a resin having a weight-average molecular weight of about $8.1 \times 10^3$ was obtained in a yield of 65%. This resin is called as resin A1. Resin A1 had the following structural units.

Resin Synthesis Example 2

The monomers (a1-1-2m), (a2-1-1m) and (a3-1-1m) were mixed in a molar ratio of 50/25/25 (monomer (a1-1-2m)/monomer (a2-1-1m)/monomer (a3-1-1m)), and 1,4-dioxane in 1.5 times part based on total parts of all monomers was added to prepare a solution.

To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 80° C. for about 8 hours. The reaction mixture obtained was poured into a large amount of a mixture of methanol and water to cause precipitation. The precipitate was collected by filtration and then, was dissolved in 1,4-dioxane followed by poured the resultant solution into a large amount of a mixture of methanol and water to cause precipitation. This operation was repeated twice for purification. As a result, a resin having a weight-average molecular weight of about $9.2 \times 10^3$ was obtained in a yield of 60%. This resin is called as resin A2. Resin A2 had the following structural units.

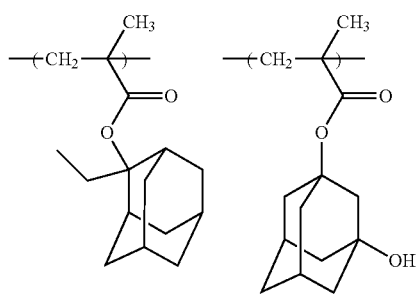

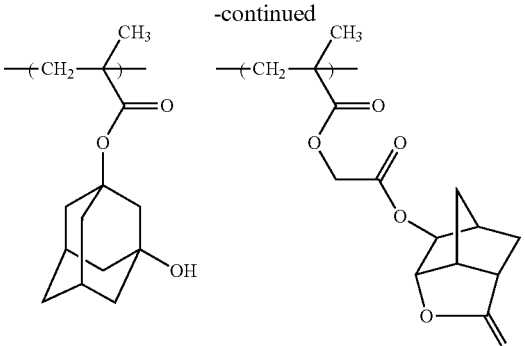

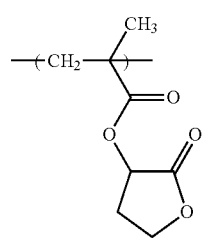

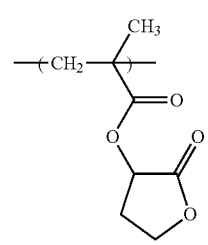

Resin Synthesis Example 3

The monomers (a1-1-3m), (a1-2-3m), (a2-1-1m), (a3-2-3m) and (a3-1-1m) were mixed in a molar ratio of 30/14/6/20/30 (monomer (a1-1-3m)/monomer (a1-2-3m)/monomer (a2-1-1m)/monomer (a3-2-3m)/monomer (a3-1-1m)), and 1,4-dioxane in 1.5 times part based on total parts of all monomers was added to prepare a solution.

To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 75° C. for about 5 hours. The reaction mixture obtained was poured into a large amount of a mixture of methanol and water to cause precipitation. The precipitate was collected by filtration and then, was dissolved in 1,4-dioxane followed by poured the resultant solution into a large amount of a mixture of methanol and water to cause precipitation. This operation was repeated twice for purification. As a result, a resin having a weight-average molecular weight of about $7.0 \times 10^3$ was obtained in a yield of 60%. This resin is called as resin A3. Resin A3 had the following structural units.

Resin Synthesis Example 4

The monomers (a1-1-3m), (a1-5-1), (a2-1-1m), (a3-2-3m) and (a3-1-1m) were mixed in a molar ratio of 30/14/6/20/30 (monomer (a1-1-3m)/monomer (a1-5-1)/monomer (a2-1-1m)/monomer (a3-2-3m)/monomer (a3-1-1m)), and 1,4-dioxane in 1.5 times part based on total parts of all monomers was added to prepare a solution.

To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 75° C. for about 5 hours. The reaction mixture obtained was poured into a large amount of a mixture of methanol and water to cause precipitation. The precipitate was collected by filtration and then, was dissolved in 1,4-dioxane followed by poured the resultant solution into a large amount of a mixture of methanol and water to cause precipitation. This operation was repeated twice for purification. As a result, a resin having a weight-average molecular weight of about $7.4 \times 10^3$ was obtained in a yield of 62%. This resin is called as resin A4. Resin A4 had the following structural units.

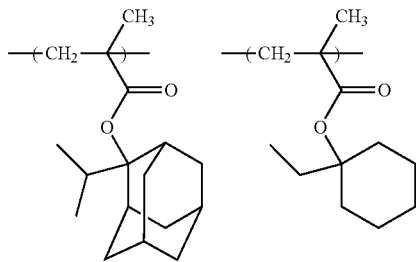

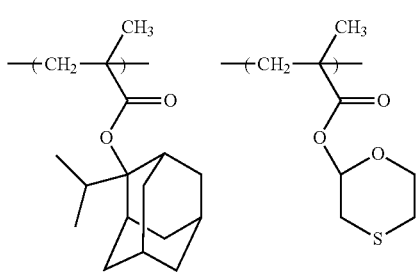

-continued

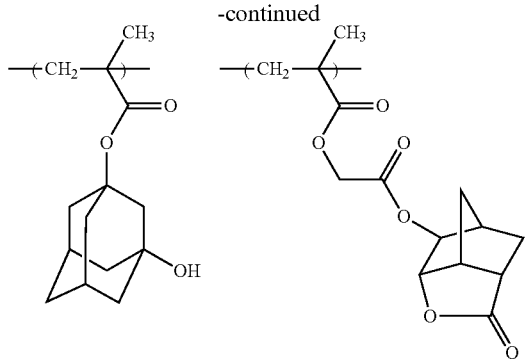

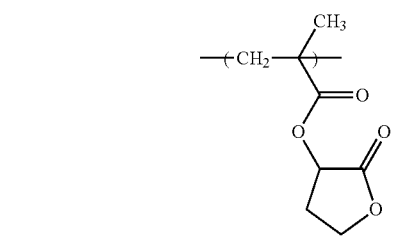

Synthetic Example 1

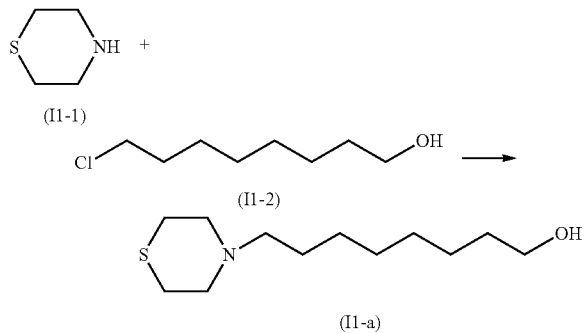

A mixture containing 5.00 parts of the compound represented by the formula (I1-2), 25.00 parts of methyl isobutyl ketone and 1.37 parts of N-methylpyrrolidine was stirred at 23° C. for 30 minutes.

To the mixture, 6.27 parts of the compound represented by the formula (I1-1) was added dropwise over 30 minutes, and the resultant mixture was stirred at 100° C. for 20 hours. After cooling, the reaction mixture obtained was mixed with 12.5 parts of ion-exchanged water.

The resultant mixture was stirred and then, separated to obtain an organic layer. The organic layer was washed five times with 12.5 parts of ion-exchanged water. The organic layer obtained was mixed with 0.26 part of activated carbon, and the resultant mixture was stirred at 23° C. for 30 minutes. The mixture obtained was filtrated and the filtrate obtained was concentrated to obtain 3.74 parts of the compound represented by the formula (I1-a).

MS (molecular ion peak): 231.2

Synthetic Example 2

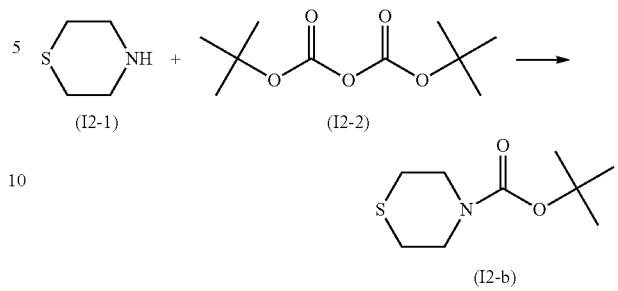

A mixture containing 2.50 parts of the compound represented by the formula (I2-1), 2.94 parts of triethylamine and 12.50 parts of tetrahydrofuran was stirred at 23° C. for 30 minutes. To the mixture, a solution prepared by mixing 5.29 parts of the compound represented by the formula (I2-2) with 5.29 parts of tetrahydrofuran was added dropwise over 10 minutes, and the resultant mixture was stirred at 23° C. for 12 hours. The reaction mixture obtained was concentrated, and the concentrate obtained was mixed with 25 parts of ethyl acetate and 8.33 parts of ion-exchanged water. The resultant mixture was stirred at 23° C. for 30 minutes, and then, separated to obtain an organic layer. The organic layer was washed four times with 8.33 parts of ion-exchanged water. The organic layer obtained was concentrated to obtain 4.42 parts of the compound represented by the formula (I2-b).

MS (molecular ion peak): 203.1

Synthetic Example 3

A mixture containing 8.05 parts of the compound represented by the formula (I3-2), 40.25 parts of methyl isobutyl ketone and 1.37 parts of N-methylpyrrolidine was stirred at 23° C. for 30 minutes.

To the mixture, 6.27 parts of the compound represented by the formula (I1-1) was added dropwise over 30 minutes, and the resultant mixture was stirred at 100° C. for 20 hours. After cooling, the reaction mixture obtained was mixed with 20 parts of ion-exchanged water.

The resultant mixture was stirred and then, separated to obtain an organic layer. The organic layer was washed five times with 20 parts of ion-exchanged water. The organic layer obtained was mixed with 0.35 part of activated carbon, and the resultant mixture was stirred at 23° C. for 30 minutes. The mixture obtained was filtrated and the filtrate obtained was concentrated to obtain 4.28 parts of the compound represented by the formula (I3-a).

MS (molecular ion peak): 287.2

Examples 1 to 10 and Comparative Example 1

Resin

Resin A1, A2, A3, A4
<Acid Generator>
B1:

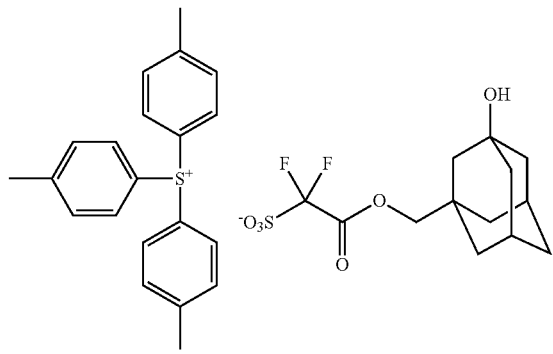

<Component (X)>
I1-a: Compound represented by the formula (I1-a)
I2-b: Compound represented by the formula (I2-b)
I3-a: Compound represented by the formula (I3-a)
<Quencher>
C1: 2,6-diisopropylaniline
C2:

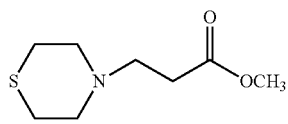 [SMILES: COC(=O)CCN1CCSCC1]

| <Solvent> | | |
|---|---|---|
| E1: | propylene glycol monomethyl ether acetate | 265 parts |
| | propylene glycol monomethyl ether | 20 parts |
| | 2-heptanone | 20 parts |
| | γ-butyrolactone | 3.5 parts |

The following components were mixed and dissolved, further, filtrated through a fluorine resin filter having pore diameter of 0.2 μm, to prepare photoresist compositions.
Resin (kind and amount are described in Table 1)
Acid generator (kind and amount are described in Table 1)
Component (X) (kind and amount are described in Table 1)
Quencher (kind and amount are described in Table 1)
Solvent E1

TABLE 1

| Ex. No. | Resin (kind/amount (part)) | Acid generator (kind/amount (part)) | Component (X) (kind/amount (part)) | Quencher (kind/amount (part)) |
|---|---|---|---|---|
| Ex. 1 | A1/10 | B1/1.20 | I1-a/0.15 | — |
| Ex. 2 | A1/10 | B1/1.20 | I2-b/0.15 | — |
| Ex. 3 | A1/10 | B1/1.20 | I1-a/0.10 | C1/0.03 |
| Ex. 4 | A1/10 | B1/1.20 | I2-b/0.10 | C1/0.03 |
| Ex. 5 | A2/10 | B1/1.20 | I1-a/0.15 | — |
| Ex. 6 | A2/10 | B1/1.20 | I2-b/0.15 | — |
| Ex. 7 | A3/10 | B1/1.20 | I1-a/0.15 | — |
| Ex. 8 | A4/10 | B1/1.20 | I1-a/0.15 | — |
| Ex. 9 | A3/10 | B1/1.20 | I3-a/0.17 | — |
| Ex. 10 | A4/10 | B1/1.20 | I3-a/0.17 | — |
| Comp. Ex. 1 | A2/10 | B1/1.20 | — | C2/0.15 |

TABLE 2

| Ex. No. | PB (° C.) | PEB (° C.) |
|---|---|---|
| Ex. 1 | 100 | 100 |
| Ex. 2 | 100 | 100 |
| Ex. 3 | 100 | 100 |
| Ex. 4 | 100 | 100 |
| Ex. 5 | 110 | 110 |
| Ex. 6 | 110 | 110 |
| Ex. 7 | 100 | 100 |
| Ex. 8 | 100 | 100 |
| Ex. 9 | 100 | 100 |
| Ex. 10 | 100 | 100 |
| Comp. Ex. 1 | 110 | 110 |

Silicon wafers were each coated with "ARC-29", which is an organic anti-reflective coating composition available from Nissan Chemical Industries, Ltd., and then baked at 205° C. for 60 seconds, to form a 78 nm-thick organic anti-reflective coating. Each of the photoresist compositions prepared as above was spin-coated over the anti-reflective coating so that the thickness of the resulting film became 85 nm after drying. The silicon wafers thus coated with the respective photoresist compositions were each prebaked on a direct hotplate at a temperature shown in the column "PB" in Table 2 for 60 seconds. Using an ArF excimer stepper for immersion exposure ("XT: 1900Gi" manufactured by ASML, NA=1.35, 3/4 Annular, X-Y polarization), each wafer thus formed with the respective resist film was subjected to contact hole pattern exposure using a photomask for forming a contact hole pattern having 100 nm of a hole pitch and 70 nm of a hole diameter with the exposure quantity being varied stepwise.

After the exposure, each wafer was subjected to post-exposure baking on a hotplate at a temperature shown in the column "PEB" in Table 2 for 60 seconds and then to paddle development for 60 seconds with an aqueous solution of 2.38% by mass tetramethylammonium hydroxide.

Each of patterns developed on the organic anti-reflective coating substrate after the development was observed with a scanning electron microscope, the results of which are shown in Table 3.

Effective sensitivity (ES): It was expressed as the amount of exposure that the hole diameter of the contact hole pattern became 55 nm after exposure and development.

CD uniformity (CDU): The photoresist patterns were obtained using a photomask for forming a contact hole pattern having a hole diameter of 70 nm and a hole pitch of 100 nm at the exposure amount of ES. Each of patterns developed on the organic anti-reflective coating substrate after the development was observed with a scanning electron microscope. The hole diameter of the contact hole patterns was twenty four times measured and its average diameter was calculated.

The average diameters of four hundred holes on the same wafer were respectively measured. When population was the average diameters of four hundred holes, the standard deviation was calculated.

Each of the standard deviations is shown in a column of "CDU" of Table 3. The smaller the standard deviation is, the better CDU the photoresist pattern shows, and the better pattern profile is.

TABLE 3

| Ex. No. | CDU |
|---|---|
| Ex. 1 | 1.63 |
| Ex. 2 | 1.69 |
| Ex. 3 | 1.68 |
| Ex. 4 | 1.74 |
| Ex. 5 | 1.85 |
| Ex. 6 | 1.89 |
| Ex. 7 | 1.62 |
| Ex. 8 | 1.58 |
| Ex. 9 | 1.57 |
| Ex. 10 | 1.54 |
| Comp. Ex. 1 | 2.02 |

The photoresist composition of the present invention provides a photoresist pattern having a good CD uniformity.

What is claimed is:

1. A photoresist composition comprising the following components (A), (B) and (X):
   (A) a resin being insoluble or poorly soluble in an aqueous alkali solution but becoming soluble in an aqueous alkali solution by the action of an acid,
   (B) an acid generator,
   (X) at least one compound selected from the group consisting of a compound represented by the formula (I-a):

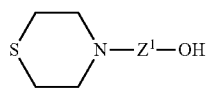

(I-a)

wherein $Z^1$ represent a C1-C20 divalent saturated aliphatic hydrocarbon group in which one or more —CH$_2$— may be replaced by —O— or —CO—, and a compound represented by the formula (I-b):

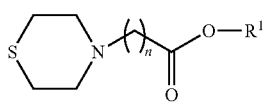

(I-b)

wherein $R^1$ represents a C1-C20 monovalent saturated aliphatic hydrocarbon group in which one or more hydrogen atoms may be substituted with a hydroxyl group and one or more —CH$_2$— may be replaced by —O— or —CO—, and n represents 0 or 1.

2. The photoresist composition according to claim 1, wherein component (X) is the compound represented by the formula (I-a).

3. The photoresist composition according to claim 1, wherein component (X) is the compound represented by the formula (I-b).

4. The photoresist composition according to claim 1, wherein $Z^1$ is a C1-C12 alkanediyl group or a C6-C20 divalent alicyclic saturated hydrocarbon group in the formula (I-a).

5. The photoresist composition according to claim 1, wherein $R^1$ is a tert-butyl group or a tert-amyl group and n is 0 in the formula (I-b).

6. The photoresist composition according to claim 1, wherein component (B) is a salt represented by the formula (B1):

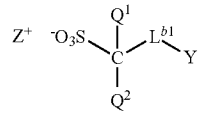

(B1)

wherein $Q^1$ and $Q^2$ each independently represent a fluorine atom or a C1-C6 perfluoroalkyl group, $L^{b1}$ represents a single bond or a C1-C17 divalent aliphatic hydrocarbon group which can have one or more substituents, and one or more —CH$_2$— in the divalent aliphatic hydrocarbon group can be replaced by —O— or —CO—, Y represents a C1-C18 aliphatic hydrocarbon group which can have one or more substituents and in which one or more —CH$_2$— can be replaced by —O—, —CO— or —SO$_2$—, and $Z^+$ represents an organic cation.

7. The photoresist composition according to claim 6, wherein $L^{b1}$ is a group represented by *—CO—O-$L^{b2}$- wherein $L^{b2}$ represents a single bond or a C1-C15 alkanediyl group and * represents a binding position to —C($Q^1$)($Q^2$)- in the formula (B1).

8. The photoresist composition according to claim 6, wherein Y is a C3-C18 alicyclic hydrocarbon group which can have one or more substituents and in which one or more —CH$_2$— can be replaced by —O—, —CO— or —SO$_2$— in the formula (B1).

9. The photoresist composition according to claim 1, which further comprises a solvent.

10. A process for producing a photoresist pattern comprising:
   (1) a step of applying the photoresist composition according to any one of claims 1 to 9 on a substrate to form a photoresist composition layer,
   (2) a step of forming a photoresist film by drying the photoresist composition layer formed,
   (3) a step of exposing the photoresist film to radiation,
   (4) a step of heating the photoresist film after exposing, and
   (5) a step of developing the photoresist film after heating.

* * * * *